(12) United States Patent
Chan et al.

(10) Patent No.: US 9,106,027 B2
(45) Date of Patent: Aug. 11, 2015

(54) METHODS, APPARATUSES AND SYSTEMS FOR MID-PLANE MOUNTING PARALLEL OPTICAL COMMUNICATIONS MODULES ON CIRCUIT BOARDS

(71) Applicant: Avago Technologies General IP (Singapore) Pte. Ltd., Singapore (SG)

(72) Inventors: Seng-Kum Chan, Santa Clara, CA (US); Chaitanya Arekar, San Jose, CA (US); Hui Xu, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 221 days.

(21) Appl. No.: 13/724,056

(22) Filed: Dec. 21, 2012

(65) Prior Publication Data

US 2014/0179129 A1 Jun. 26, 2014

(51) Int. Cl.
| | |
|---|---|
| *H01R 13/60* | (2006.01) |
| *H01R 13/62* | (2006.01) |
| *H01R 12/70* | (2011.01) |
| *H01R 12/71* | (2011.01) |
| *H05K 3/30* | (2006.01) |
| *G02B 6/42* | (2006.01) |

(52) U.S. Cl.
CPC .......... *H01R 12/7029* (2013.01); *H01R 12/714* (2013.01); *G02B 6/428* (2013.01); *G02B 6/4246* (2013.01); *H05K 3/301* (2013.01); *H05K 2201/10121* (2013.01); *H05K 2201/10325* (2013.01); *Y10T 29/4913* (2015.01)

(58) Field of Classification Search
CPC ............. H01R 12/7076; H01R 13/447; H01R 13/5213; H01R 43/0256; H01R 43/0263; Y10S 439/94

USPC ...................................................... 439/331, 71
See application file for complete search history.

(56) References Cited

U.S. PATENT DOCUMENTS

| | | | | |
|---|---|---|---|---|
| 5,184,211 | A | * | 2/1993 | Fox ................................ 257/706 |
| 5,268,814 | A | * | 12/1993 | Yakubowski .................. 361/704 |
| 6,205,026 | B1 | * | 3/2001 | Wong et al. .................... 361/704 |
| 6,231,370 | B1 | * | 5/2001 | Morin et al. ................... 439/366 |
| 6,551,134 | B1 | * | 4/2003 | Yunker et al. ................. 439/564 |
| 6,659,795 | B1 | | 12/2003 | Lai et al. |
| 7,287,914 | B2 | * | 10/2007 | Fujiwara et al. ................ 385/88 |
| 7,507,101 | B2 | * | 3/2009 | Chiang .......................... 439/331 |
| 7,534,052 | B2 | * | 5/2009 | Fujiwara et al. ................ 385/88 |
| 7,628,615 | B2 | | 12/2009 | Lin et al. |
| 7,892,008 | B2 | * | 2/2011 | Hsu et al. ...................... 439/331 |
| 8,062,048 | B2 | * | 11/2011 | Ma .................................. 439/331 |
| 8,188,381 | B2 | * | 5/2012 | Chan ............................. 174/382 |
| 8,191,245 | B2 | | 6/2012 | Hougham et al. |
| 2011/0195607 | A1 | | 8/2011 | De Bruijn |

FOREIGN PATENT DOCUMENTS

WO 9617378 A1 6/1996

* cited by examiner

*Primary Examiner* — Xuong Chung Trans

(57) ABSTRACT

A socket is provided that is configured to be secured to a surface of a host circuit board by solder using a solder reflow process. The solder reflow process that is used for this purpose may be the same solder reflow process that is used to make electrical connections between the array of electrical contacts disposed on the lower surface of the socket and the array of electrical contacts disposed on the upper surface of the host CB. Because the solder reflow process is an automated process, the process of securing the socket to the surface of the host CB does not have to be performed manually, but can be performed automatically as part of a typical automated surface mount technology (SMT) process of the type that is typically used to mount components on a PCB.

24 Claims, 20 Drawing Sheets

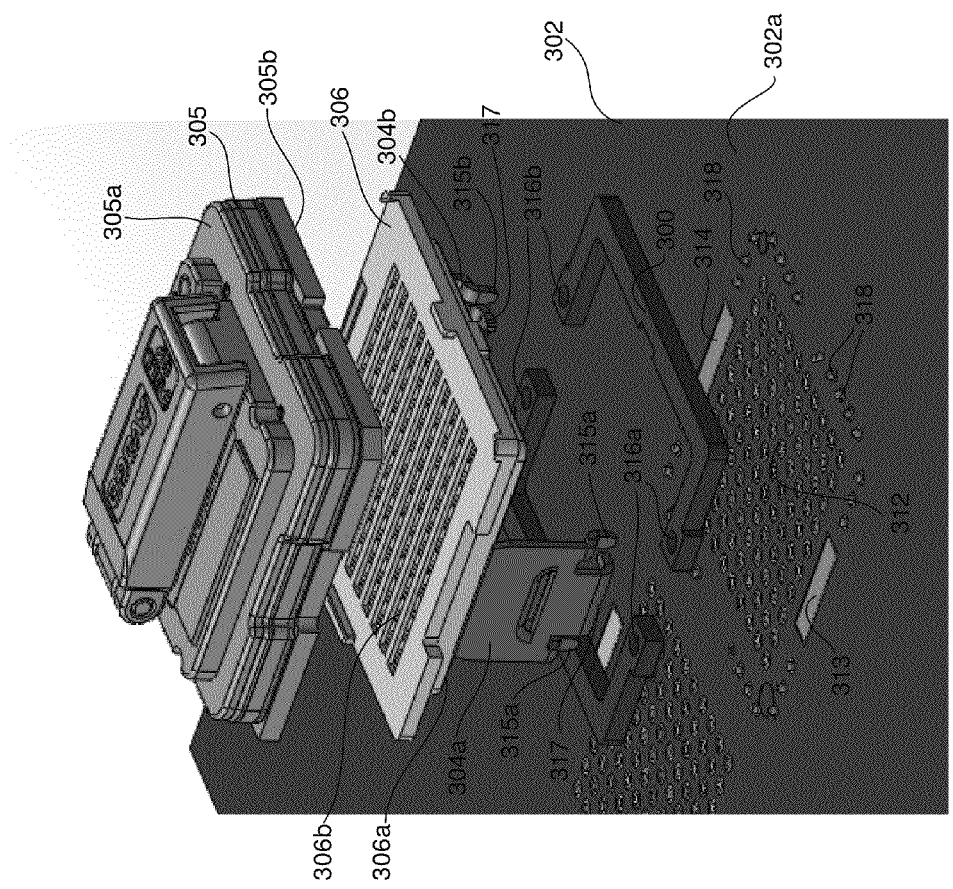

METHODS, APPARATUSES AND SYSTEMS FOR MID-PLANE MOUNTING PARALLEL OPTICAL COMMUNICATIONS MODULES ON CIRCUIT BOARDS

TECHNICAL FIELD OF THE INVENTION

The invention relates to optical communications modules. More particularly, the invention relates to methods, apparatuses and systems for mid-plane mounting parallel optical communications modules on circuit boards.

BACKGROUND OF THE INVENTION

A parallel optical communications module is a module having multiple transmit (TX) channels, multiple receive (RX) channels, or both. A parallel optical transceiver module is an optical communications module that has multiple TX channels and multiple RX channels in the TX and RX portions, respectively, of the transceiver. A parallel optical transmitter module is an optical communications module that has multiple TX channels, but no RX channels. A parallel optical receiver module is an optical communications module that has multiple RX channels, but no TX channels.

The TX portion of a parallel optical communications module comprises components for generating modulated optical signals, which are then transmitted over multiple optical fibers. The TX portion includes a laser driver circuit and a plurality of laser diodes. The laser driver circuit outputs electrical signals to the laser diodes to modulate them. When the laser diodes are modulated, they output optical signals that have power levels corresponding to logic 1s and logic 0s. An optics system of the transceiver module focuses the optical signals produced by the laser diodes into the ends of respective transmit optical fibers held within a connector that mates with the transceiver module.

The RX portion of a parallel optical communications module includes a plurality of receive photodiodes that receive incoming optical signals output from the ends of respective receive optical fibers held in the connector. The optics system of the transceiver module focuses the light that is output from the ends of the receive optical fibers onto the respective receive photodiodes. The receive photodiodes convert the incoming optical signals into electrical analog signals. An electrical detection circuit, such as a transimpedance amplifier (TIA), receives the electrical signals produced by the receive photodiodes and outputs corresponding amplified electrical signals, which are processed in the RX portion to recover the data.

A mid-plane mounting configuration for a parallel optical communications module is one in which the module is mounted on the surface of a host printed circuit board (PCB). A typical mid-plane mounting configuration includes a socket that is mounted on the host PCB and a parallel optical communications module that is mounted in the socket. The socket has a bottom and typically has side walls. Arrays of electrical contacts are disposed on upper and lower surfaces of the bottom of the socket. The parallel optical communications module has an array of electrical contacts disposed on its lower surface that electrically connects with the array of electrical contacts disposed on the upper surface of the socket when the module is mounted on the socket. A well known type of socket that is used for this purpose is a mezzanine-type socket, which is a molded plastic receptacle having an array of electrically-conductive balls, known as a ball grid array (BGA), disposed on its lower surface, and having an array of electrically-conductive spring fingers disposed on its upper surface. Other types of sockets have similar designs. Some sockets have a land grid array (LGA) instead of a BGA on their lower and/or upper surfaces.

The socket is typically secured to the surface of the host PCB by drilling holes through the host PCB and inserting fastening devices (e.g., screws) through the holes formed in the host PCB and through holes formed in the socket to fasten the socket to the host PCB. After the socket has been secured to the host PCB, the optical communications module is mounted on the socket such that the array of electrical contacts disposed on the lower surface of the module is electrically connected to the array of electrical contacts disposed on the upper surface of the bottom of the socket. Securing the socket to the host PCB in this manner reduces mechanical shocks and vibrations to the module that could otherwise damage the module or detrimentally affect its performance due to loss of connectivity between socket and module.

One of the problems associated with securing the socket to the host PCB in this manner is that electrical conductors of the host PCB cannot be routed through the locations where the holes have been drilled in the host PCB. This presents challenges when it comes to designing the routes of the host PCB. Another problem that is caused by drilling holes in the host PCB is that the processes of drilling the holes and using fastening devices to secure the socket to the host PCB are manual processes that are very time consuming and not well suited for automation.

Accordingly, a need exists for a method and apparatus for mid-plane mounting a parallel optical communications module on a host PCB that eliminate the need to drill holes in the host PCB and that allow the module to be secured to the host PCB without having to manually install fastening devices.

SUMMARY OF THE INVENTION

The invention is directed to apparatuses, systems and methods for mid-plane mounting a parallel optical communications module on a host circuit board (CB) without the need for drilling holes in the host CB in order to fasten a socket to the host CB. In accordance with one embodiment, the apparatus comprises a socket configured to interface a parallel optical communications module with a host CB. The socket has first and second lugs mechanically coupled therewith. The first and second lugs are configured to abut against one or more surfaces of the parallel optical communications module when the socket is mounted on a mounting surface of the host CB and the module is mounted in the socket. The abutment of the lugs against the module prevents movement of the module relative to the host CB. The socket is configured to be secured to the mounting surface of the host CB by soldering portions of the first and second lugs to first and second solder pads, respectively, disposed on the surface of the host CB.

In accordance with another embodiment, the apparatus comprises a socket and a cover. The socket is configured to interface a parallel optical communications module with a host CB and includes sides and a bottom. The bottom has an upper surface and a lower surface. The upper surface of the bottom has a first array of electrical contacts thereon. The lower surface of the bottom has a second array of electrical contacts thereon. The socket has at least first and second lugs mechanically coupled therewith that are configured to abut against one or more surfaces of a parallel optical communications module when the module is mounted in the socket. The abutment of the first and second lugs against the module prevents, or at least reduces, movement of the module relative to the host CB. The socket is configured to be secured to a surface of the host CB by soldering portions of the first and second lugs to first and second solder pads, respectively, disposed on the surface of the host CB.

The cover is secured to the socket such that the cover protects the first array of electrical contacts from the environment. The cover includes a lug-holding mechanism for holding the first and second lugs in place while the portions of the first and second lugs are soldered to the first and second solder pads, respectively.

The system comprises a host CB, a socket and a parallel optical communications module. The host CB has at least one mounting surface that has at least first and second solder pads on it. The socket is configured to interface the parallel optical communications module with the host CB. The socket has first and second lugs mechanically coupled therewith. The first and second lugs are secured by solder bonds to the first and second solder pads, respectively. The solder bonds prevent, or at least reduce, movement of the socket relative to the host CB. The parallel optical communications module is mounted in the socket. The first and second lugs abut one or more surfaces of the module and exert forces on the module in directions toward the mounting surface of the host CB to prevent, or at least reduce, movement of the module relative to the host CB.

The method comprises:
providing a host CB having at least one mounting surface that has at least first and second solder pads disposed on it;
providing a socket configured to interface a parallel optical communications module with the host CB and having first and second lugs mechanically coupled with it;
aligning the socket with the array of electrical contacts and with the first and second solder pads disposed on the mounting surface of the host CB and mounting the socket on the mounting surface of the host CB in the aligned position;
soldering portions of the first and second lugs to the first and second solder pads, respectively, to provide solder bonds that prevent, or at least reduce, movement of the socket relative to the host CB; and
mounting a parallel optical communications module in the socket such that the first and second lugs abut one or more surfaces of the module and exert forces on the module in directions toward the mounting surface of the host CB to prevent, or at least reduce, movement of the module relative to the host CB.

In accordance with another embodiment, an interposer is provided for use in a mid-plane mounting arrangement for interfacing an array of electrical contacts disposed on a first surface of a first structure with an array of electrical contacts disposed on a first surface of a second structure. The interposer comprises a substrate and a flexible feature disposed on the first surface of the substrate. The substrate has first and second arrays of electrical contacts disposed on first and second surfaces, respectively, of the substrate. The flexible feature encircles the first array of electrical contacts such that when the first array of electrical contacts of the interposer is placed in contact with the array of electrical contacts disposed on the first surface of the first structure, the flexible feature deforms to form a seal between the first surfaces of the interposer and of the first structure. The seal encircles the arrays of electrical contacts disposed on the first surfaces of the interposer and the first structure to prevent mixed flow gasses from coming into contact with the electrical contacts of the first arrays.

These and other features and advantages of the invention will become apparent from the following description, drawings and claims.

BRIEF DESCRIPTION OF THE DRAWINGS

FIG. 2A shows the socket mechanically coupled with a cover, or cap, and positioned above an upper surface of a host CB prior to the socket being mounted on the upper surface of the host CB and prior to lugs being mechanically coupled to the cover.

FIG. 4A is a perspective view of a socket in accordance with another illustrative embodiment, a parallel optical communications module, and an interposer disassembled and positioned above a host CB.

DETAILED DESCRIPTION OF AN ILLUSTRATIVE EMBODIMENT

Figure 1A:
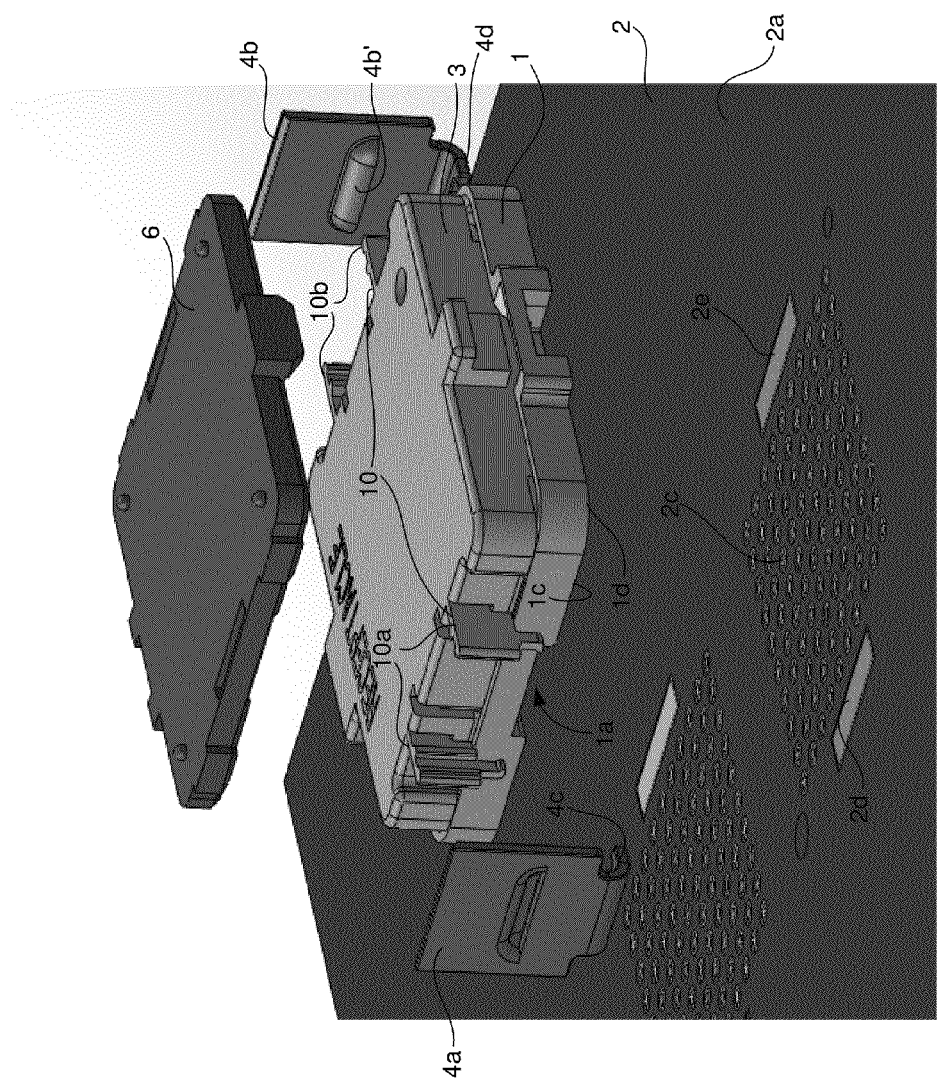
FIG. 1A is a perspective view of a socket in accordance with an illustrative embodiment; the socket is a mezzanine-type socket and is shown mechanically coupled with a cover, or cap, and positioned above an upper surface of a host CB prior to the socket being mounted on the upper surface of the host CB and prior to lugs being mechanically coupled to the cover.

In accordance with the invention, a socket is provided that is configured to be secured to a surface of a host CB by solder using a solder reflow process. The solder reflow process that is used for this purpose may be the same solder reflow process that is used to make electrical connections between the array of electrical contacts disposed on the lower surface of the socket and the array of electrical contacts disposed on the upper surface of the host CB. Because the solder reflow process is an automated process, the process of securing the socket to the surface of the host CB does not have to be performed manually, but can be performed automatically as part of a typical automated surface mount technology (SMT) process of the type that is typically used to mount components on a PCB. Various illustrative, or exemplary, embodiments of the socket and methods for securing the socket to the host CB and for securing the module to the socket will now be described with reference to the figures, in which like reference numerals represent like elements, components or features.

The term "mid-plane mounting," as that term is used herein, is intended to denote the mounting of a device or module in a plane of a surface of a CB. The term "parallel optical communications module," as that term is used herein, is intended to denote a parallel optical transceiver module, a parallel optical receiver module, or a parallel optical transmitter module. The term "CB," as that term is used herein, is intended to denote any circuit board, including, but not limited to, a PCB.

Figure 1B:
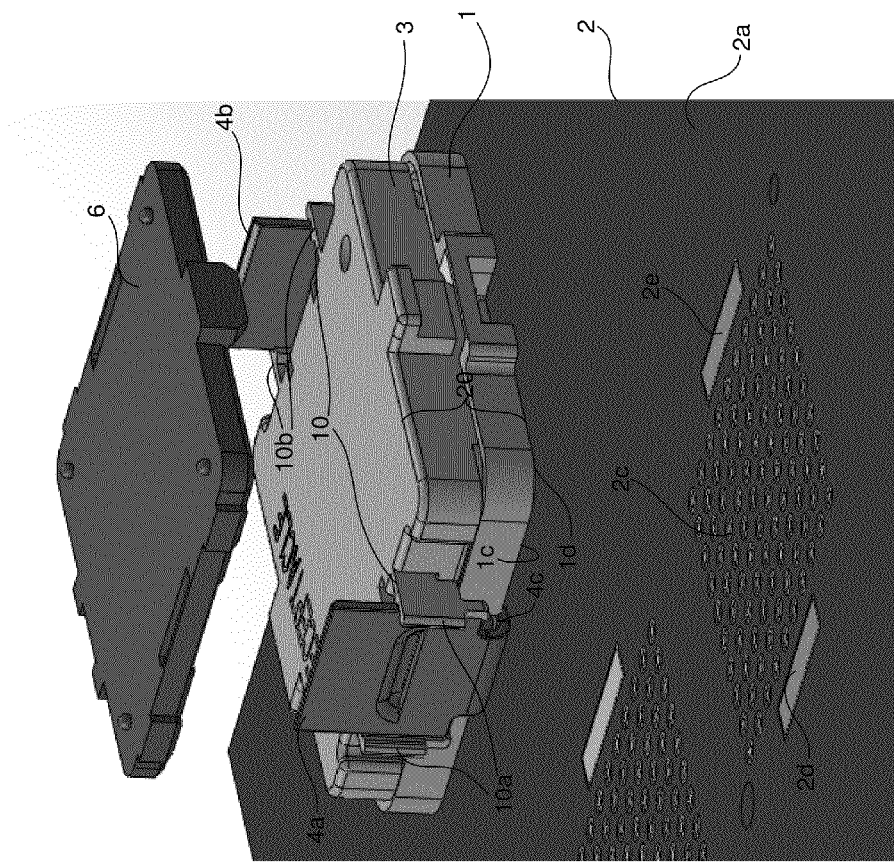
FIG. 1B is a perspective view of the socket shown in FIG. 1A mechanically coupled with the cover and positioned above the upper surface of the host CB with the first and second lugs mechanically coupled to the cover.
Figure 1C:
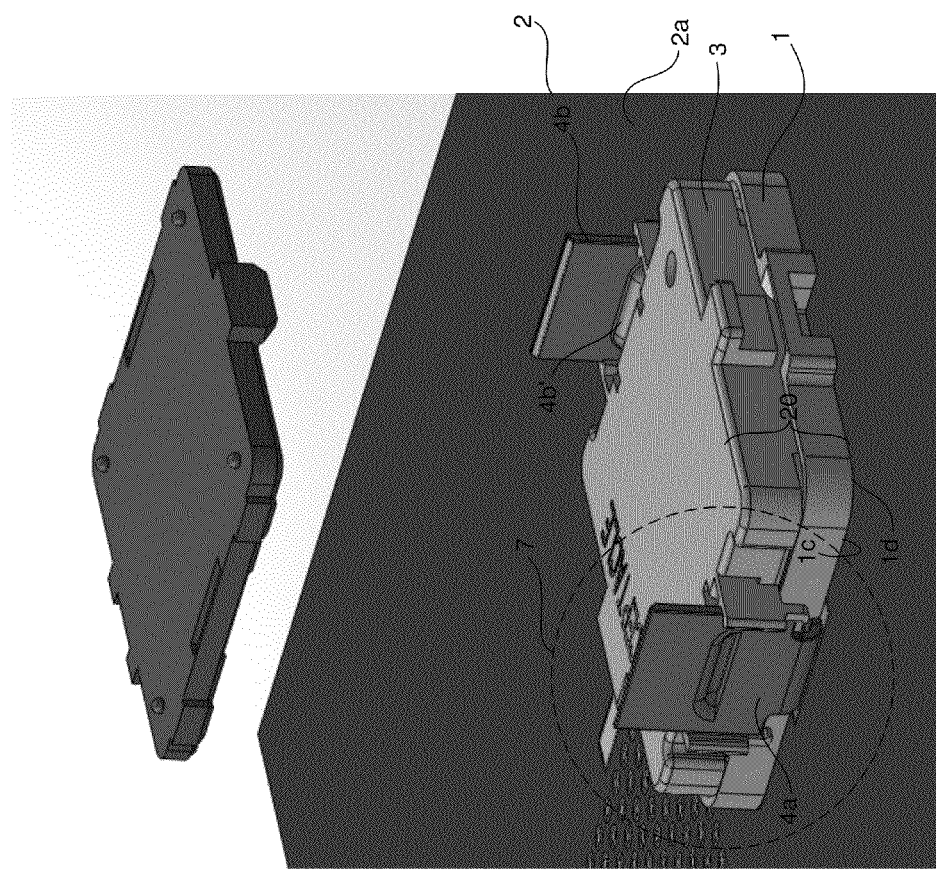
FIG. 1C is a perspective view of the socket shown in FIG. 1A mechanically coupled with the cover and mounted on the upper surface of the host CB with the lugs mechanically coupled to the cover.

FIGS. 1A-1G are top perspective views of the socket 1 and the host CB 2 in accordance with an illustrative embodiment. In accordance with this illustrative embodiment, the socket 1 is a mezzanine-type socket. FIG. 1A shows the socket 1 mechanically coupled with a cover, or cap, 3 and positioned above an upper surface 2a of the host CB 2 prior to the socket 1 being mounted on the upper surface 2a of the host CB 2 and prior to first and second lugs 4a and 4b, respectively, being mechanically coupled to the cover 3. FIG. 1B shows the socket 1 mechanically coupled with the cover 3 and positioned above the upper surface 2a of the host CB 2 prior to the socket 1 being mounted on the upper surface 2a of the host CB 2 and after the first and second lugs 4a and 4b, respectively, have been mechanically coupled to the cover 3. FIG. 1C shows the socket 1 mechanically coupled with the cover 3 and mounted on the upper surface 2a of the host CB 2 with the first and second lugs 4a mechanically coupled to the cover 3.

Figure 1D:
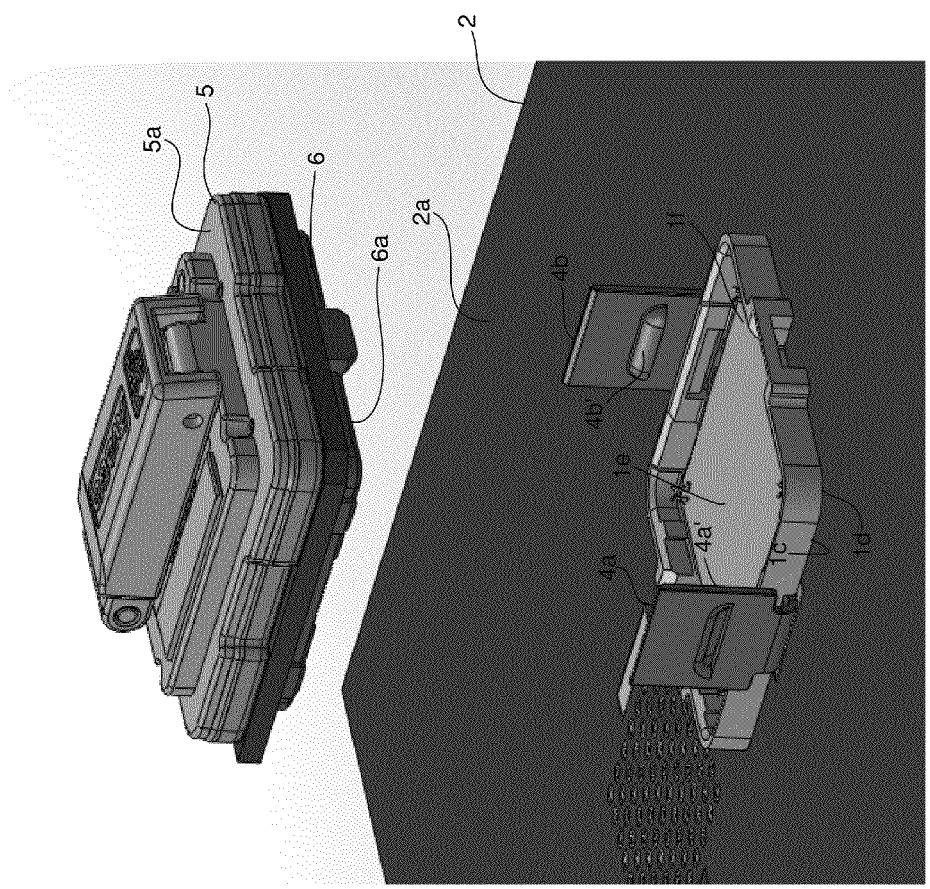
FIG. 1D is a perspective view of the socket 1 shown in FIG. 1A mounted on the upper surface of the host CB with the cover removed and with a parallel optical communications module positioned above the socket on a mezzanine-type plug.
Figure 1E:
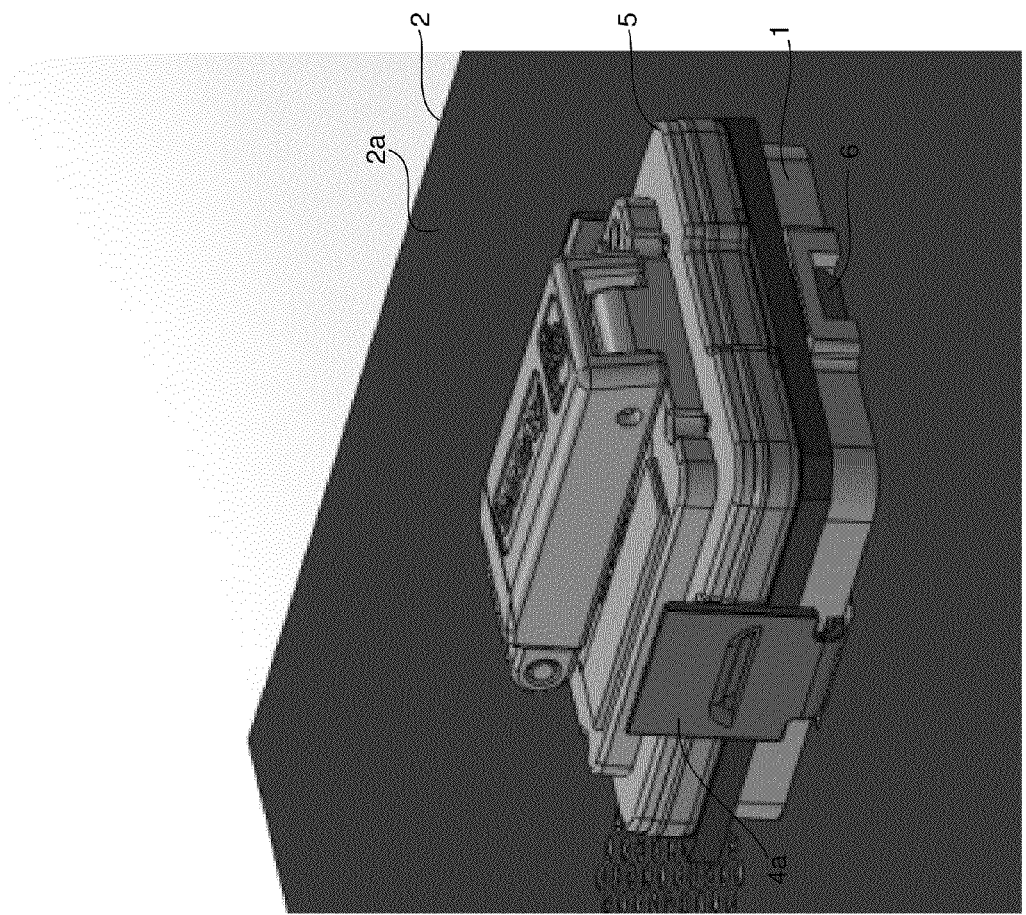
FIG. 1E is a perspective view of the socket shown in FIG. 1D mounted on the upper surface of the host CB and having the parallel optical communications module/plug mounted on the socket and held in place by the lugs.
Figure 1G:
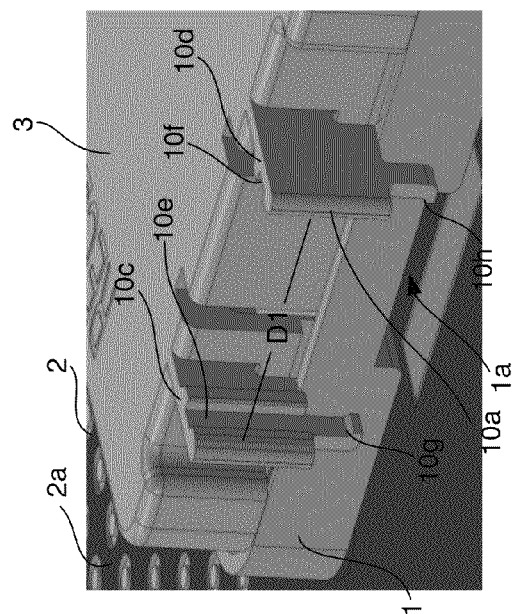
FIG. 1G is the enlarged view shown in FIG. 1F with the lug removed to show the mechanism on the cover for holding the lug in place while the socket is being soldered to the upper surface of the host CB.
Figure 1F:
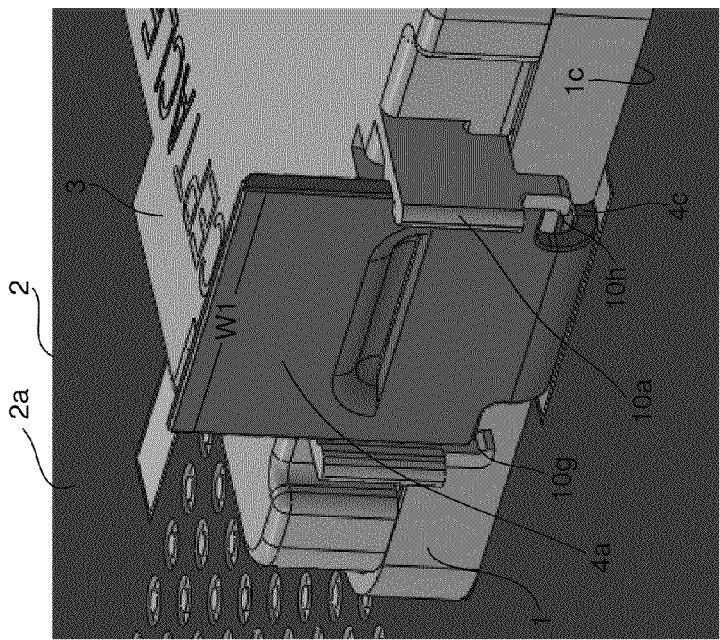
FIG. 1F is an enlarged view of a portion of the view shown in FIG. 1C, which shows the mechanism for mechanically coupling the lugs to the cover.

FIG. 1D shows the socket 1 mounted on the upper surface 2a of the host CB 2 with the cover 3 removed and with a parallel optical communications module 5 positioned above the socket 1 on a mezzanine-type plug 6. The plug 6 may be viewed as being part of the module 5. FIG. 1E shows the socket 1 shown in FIG. 1D with the parallel optical communications module 5/plug 6 mounted on the socket 1 and held in place by the first and second lugs 4a and 4b, respectively. FIG. 1F is an enlarged view of the portion of the view shown in FIG. 1C within the dashed circle 7, which shows the mechanism for mechanically coupling the lugs 4a and 4b with the cover 3. FIG. 1G is the enlarged view shown in FIG. 1F with the lug 4a removed to show features of the mechanism 10a on the cover 3 for holding the lug 4a in place while the socket 1 is being soldered to the upper surface 2a of the host CB 2. This embodiment will now be described with reference to FIGS. 1A-1G.

The socket 1 having the cover 3 mechanically coupled thereto with the lugs 4a and 4b mechanically coupled to the cover 3 (FIG. 1B) is typically assembled prior to shipment to the customer. After the assembly 20 (FIG. 1B) has been shipped to the customer, the customer mounts the assembly on the upper surface 2a of the host CB 2 (FIG. 1C). When assembling the socket 1, the cover 3 and the lugs 4a and 4b, the mechanism 10 (FIG. 1B) of the cover 3 is used to mechanically couple the lugs 4a and 4b to the cover 3 and to keep them vertically straight while the assembly is mounted on the upper surface 2a of the host CB 2. As shown in FIG. 1B, the mechanism 10 comprises first and second lug-holding portions 10a and 10b, respectively, for holding the first and second lugs 4a and 4b, respectively, in place on the cover 3.

As shown in FIG. 1G, the lug-holding portion 10a has first and second lug-retaining features 10c and 10d, respectively, that are spaced apart by a distance, D1, that is slightly less than the width, W1, of the first lug 4a such that the first lug 4a snaps into grooves 10e and 10f formed in the first and second lug-retaining features 10c and 10d, respectively. The lower ends of the first and second lug-retaining features 10c and 10d have vertical supports 10g and 10h, respectively, on them on which the lug 4a sits to provide vertical support for the lug 4a. The lug-holding portion 10b (FIG. 1B) has these same lug-retaining features for retaining the second lug 4b, but they are not shown in the figures for ease of illustration.

As shown in FIG. 1A, the lower ends 4c and 4d of the first and second lugs 4a and 4b, respectively, curve inwardly and pass into cut away areas 1a formed in the socket 1 such that the outer surfaces of the lower ends 4c and 4d are generally flush with the lower surface 1c of the bottom 1d of the socket 1. The upper surface 2a of the host CB 2 has an array of solder contacts 2c disposed on it. The upper surface 2a of the host CB 2 also has first and second solder pads, or strips, 2d and 2e, respectively, disposed on it on opposite sides of the array of solder contacts 2c.

In order to mount the assembly 20 (FIG. 1B) made up of the assembled socket 1, cover 3 and lugs 4a and 4b on the upper surface 2a of the host CB 2, the assembly 20 is first aligned with the array of solder contacts 2c and with the solder strips 2d and 2e. In accordance with this illustrative embodiment, a BGA (not shown) is disposed on the lower surface 1c of the bottom 1d of the socket 1. When the socket 1 is in alignment with the array 2c, the first and second solder strips 2d and 2e are in alignment with the lower ends 4c and 4d, respectively, of the first and second lugs 4a and 4b, respectively. The assembly 20 may then be placed on the upper surface 2a of the host CB 2.

When the socket 1 is placed on the upper surface 2a of the host CB 2 in the aligned position, the lower ends 4c and 4d of the first and second lugs 4a and 4b, respectively, come into abutment with the first and second solder strips 2d and 2e, respectively. A solder reflow process is then used to solder the electrical contacts of the BGA to the respective electrical contacts of the array 2c and to solder the lower ends 4c and 4d of the first and second lugs 4a and 4b, respectively, to the first and second solder strips 2d and 2e, respectively. The resulting configuration is shown in FIG. 1C.

As indicated above, the socket 1 is a mezzanine-type socket. Mezzanine-type sockets are well known in the art and have a bottom and side walls, with a BGA disposed on the lower surface of the bottom and an array of electrically conductive spring fingers disposed on the upper surface of the bottom. Other types of sockets may be use for this purpose, including, but not limited to, those which have an LGA disposed on their upper and/or lower surfaces.

The process of aligning the assembly 20 (FIG. 1B) with the array 2c and the strips 2d and 2e and placing it in the aligned position on the upper surface 2a of the host CB 2 is typically performed using a pick-and-place system that includes a machine vision system (not shown) for determining optical alignment and a robotic system (not shown) for imparting relative motion between the socket 1 and the host CB 2. Because such systems are well know in the art, the system that is used for this purpose will not be described herein in the interest of brevity. While the cover 3 is attached to the socket 1, as shown in FIGS. 1A and 1B, the cover 3 may be used by the pick-and-place system to pick up the assembly 20 and place it on the upper surface 2a of the host CB 2 in the aligned position. In other words, the pick-and-place system picks up the assembly 20 by the cover 3 and places the assembly 20 on the upper surface 2a of the host CB 2 in the aligned position. The solder reflow process not only makes the electrical connections and secures the assembly 20 to the host CB 2, the reflowing of the solder helps bring the socket 1 into its aligned position.

Once the assembly 20 has been mounted on the upper surface 2a of the host CB 2, as shown in FIG. 1C, and the solder bonds have been formed, the cover 3 is removed to expose the array of electrical contacts 1e disposed on the upper surface 1f of the bottom 1d, as shown in FIG. 1D. The array of electrical contacts 1e is typically an array of metal spring fingers. The parallel optical communications module 5 is mounted on the plug 6, as shown in FIG. 1D. The plug 6 is a well known device that has an array of electrical contacts 6a (e.g., a BGA) disposed on its lower surface. The electrical circuitry (not shown) of the parallel optical communications module is electrically connected to electrical conductors (not shown) of the. The assembled module 5/plug 6 is mounted on the upper surface 1f of the bottom 1d of the socket 1 such that the electrical contacts of the array 1e disposed on the upper surface 1f of the bottom 1d of the socket 1 come into contact with the respective electrical contacts of the array 6a disposed on the lower surface of the plug 6. Through all of these electrical connections, electrically-conductive pathways are provided between the host CB 2 and the module 5.

When the assembled module 5/plug 6 is mounted on the socket 1, protrusions 4a' and 4b' (FIG. 1D) formed on the inward-facing surfaces of the lugs 4a and 4b, respectively, are brought into abutment with an upper surface 5a of the module 5. In other words, when the assembled module 5/plug 6 is pressed down into the socket 1, the protrusions 4a' and 4b' snap into place on the upper surface 5a of the module 5. The protrusions 4a' and 4b' exert downwardly-directed forces on the module 5 that prevent the module 5 from moving in a direction up and way from the surface 2a of the host CB 2.

Figure 2A:
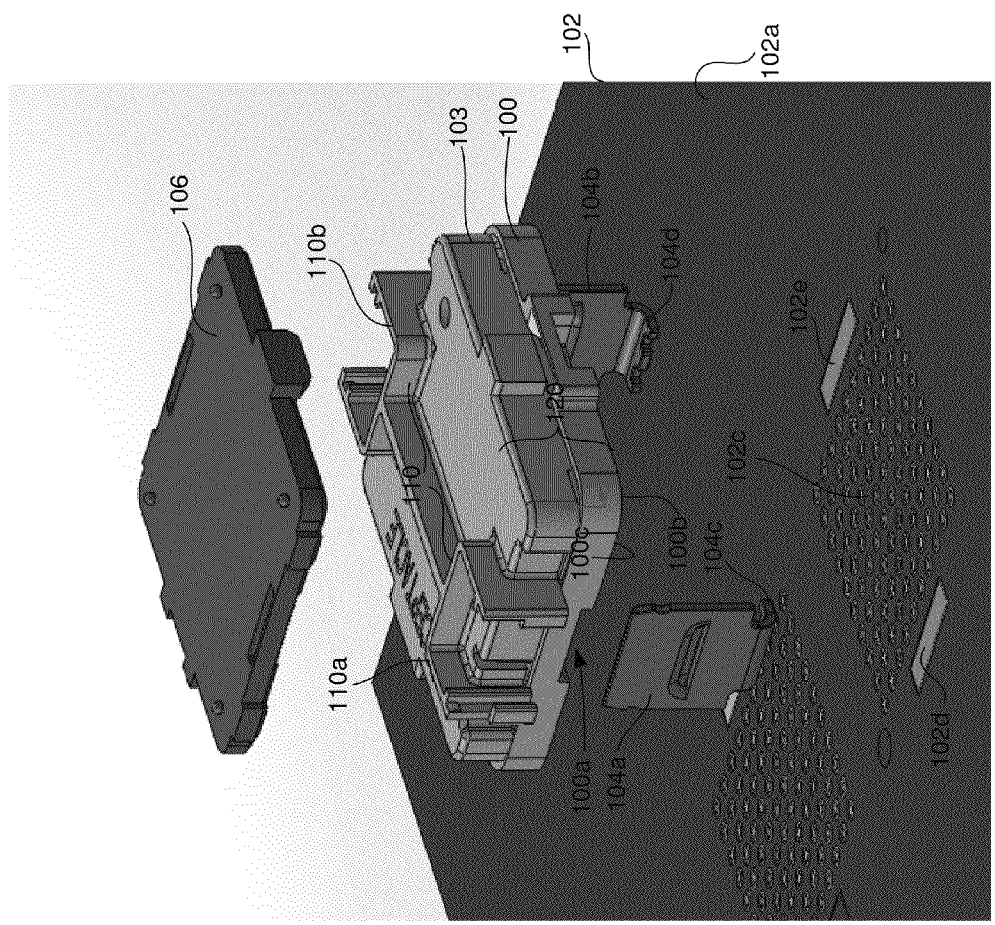
FIG. 2A is a top perspective view of a mezzanine-type socket in accordance with another illustrative embodiment.
Figure 2B:
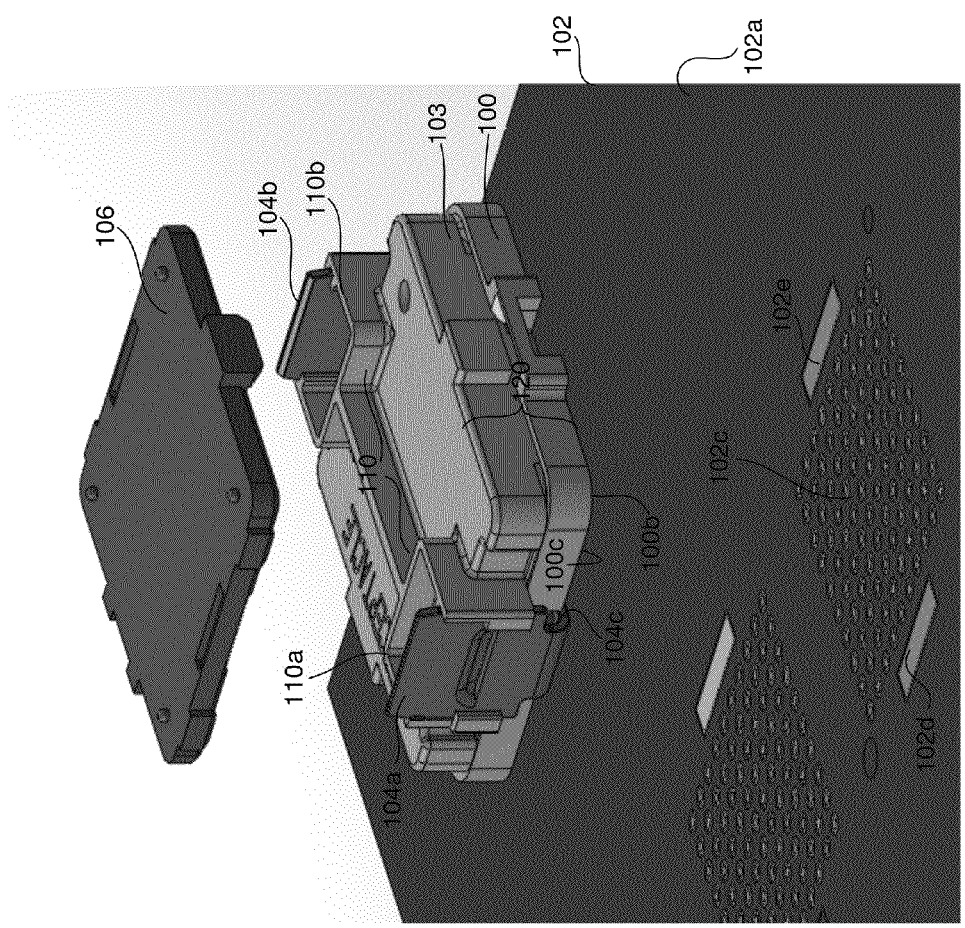
FIG. 2B is a perspective view of the socket shown in FIG. 2A mechanically coupled with the cover and positioned above the upper surface of the host CB prior to the socket being mounted on the upper surface of the host CB and after the lugs have been mechanically coupled to the cover.
Figure 2C:
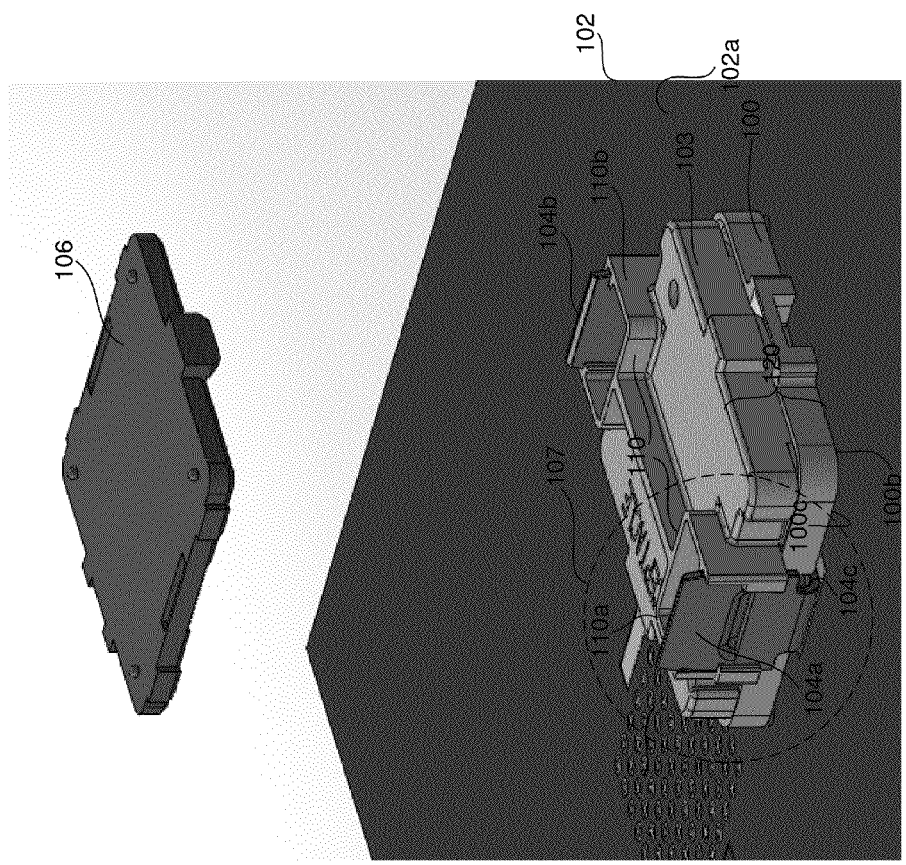
FIG. 2C is a perspective view of the socket shown in FIG. 2A mechanically coupled with the cover and mounted on the upper surface of the host CB with the first and second lugs mechanically coupled to the cover.

FIGS. 2A-2G are perspective views of the socket 100 in accordance with another illustrative embodiment. In accordance with this illustrative embodiment, the socket 100 is a mezzanine-type socket. FIG. 2A shows the socket 100 mechanically coupled with a cover, or cap, 103 and positioned above an upper surface 102a of a host CB 102 prior to first and second lugs 104a and 104b, respectively, being mechanically coupled to the cover 103. FIG. 2B shows the socket 100 mechanically coupled with the cover 103 and positioned above the upper surface 102a of the host CB 102 with the first and second lugs 104a and 104b, respectively, mechanically coupled with the cover 103. FIG. 2C shows the socket 100 mechanically coupled with the cover 103 and mounted on the upper surface 102a of the host CB 102 with the first and second lugs 104a mechanically coupled with the cover 103.

Figure 2D:
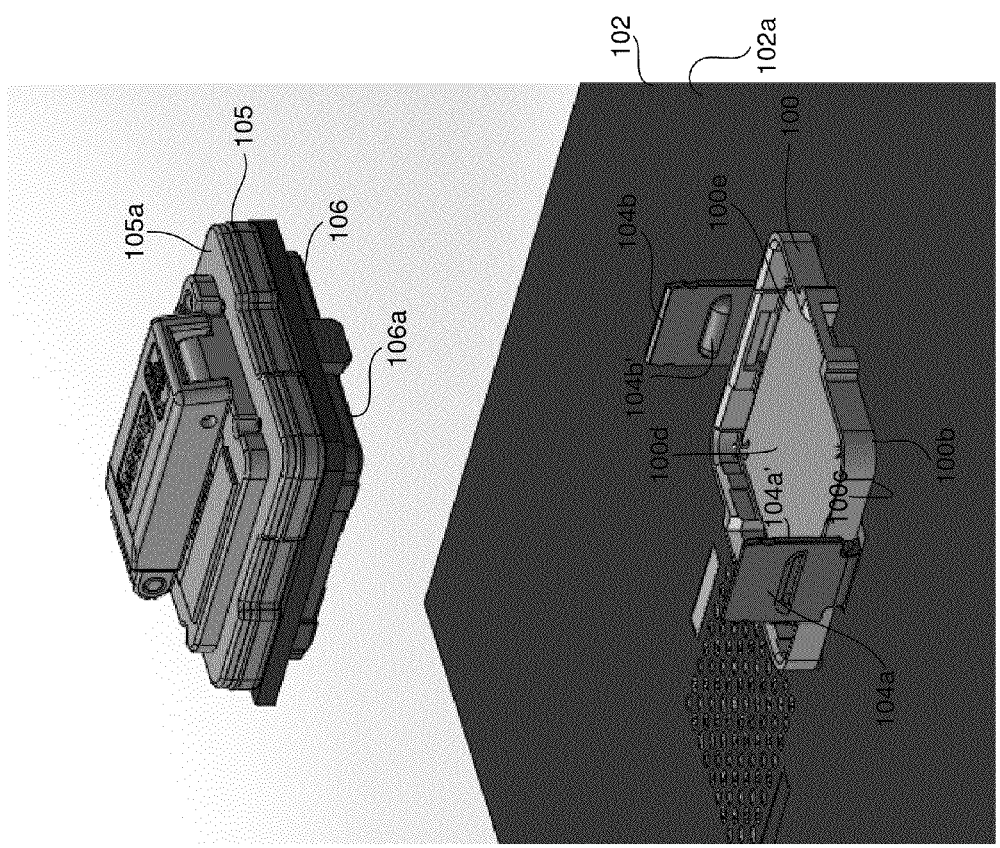
FIG. 2D is a perspective view of the socket shown in FIG. 2A mounted on the upper surface of the host CB with the cover removed and with a parallel optical communications module positioned above the socket on a mezzanine-type plug and about to be mounted in the socket.
Figure 2E:
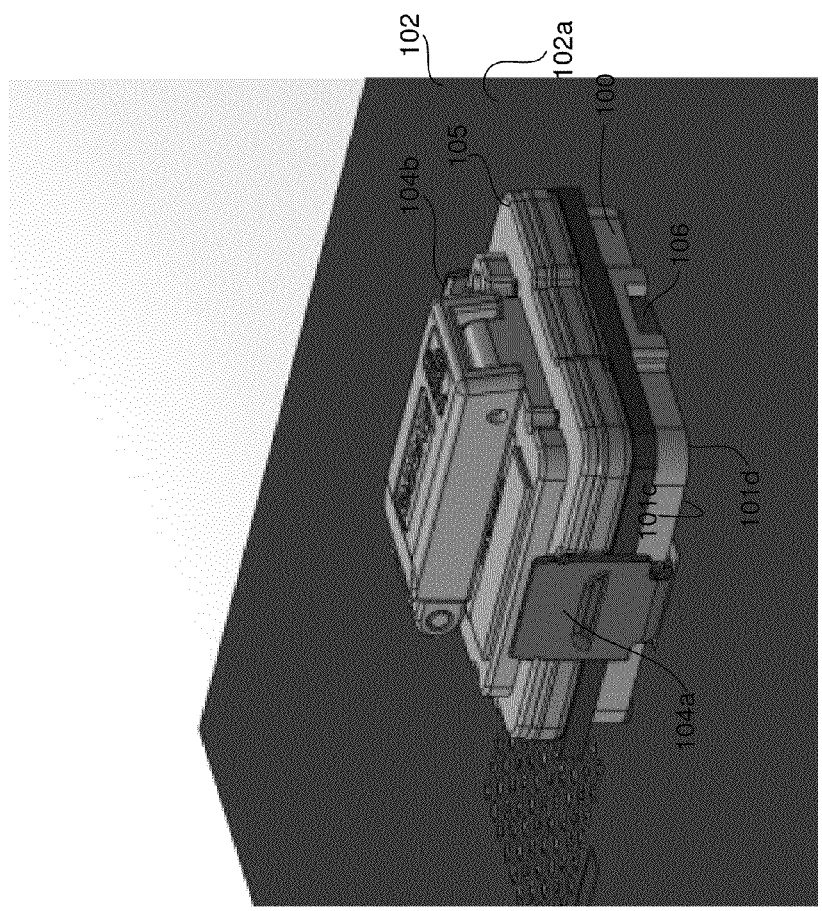
FIG. 2E is a perspective view of the socket shown in FIG. 2D mounted on the upper surface of the host CB and having the parallel optical communications module/plug mounted on the socket and held in place by the lugs.
Figure 2G:
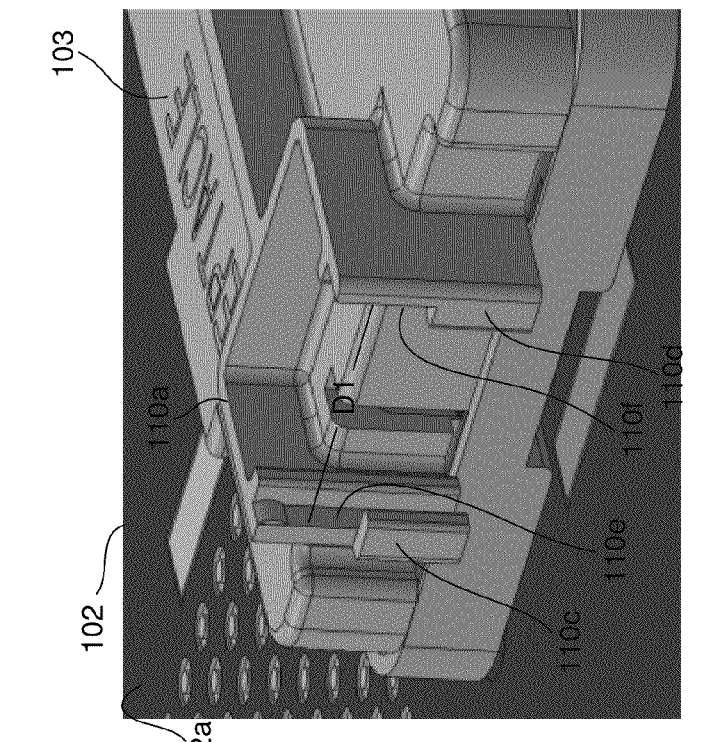
FIG. 2G is the view shown in FIG. 2F with the lug removed to show the mechanism of the cover for holding the lug in place while the socket is being soldered to the upper surface of the host CB.
Figure 2F:
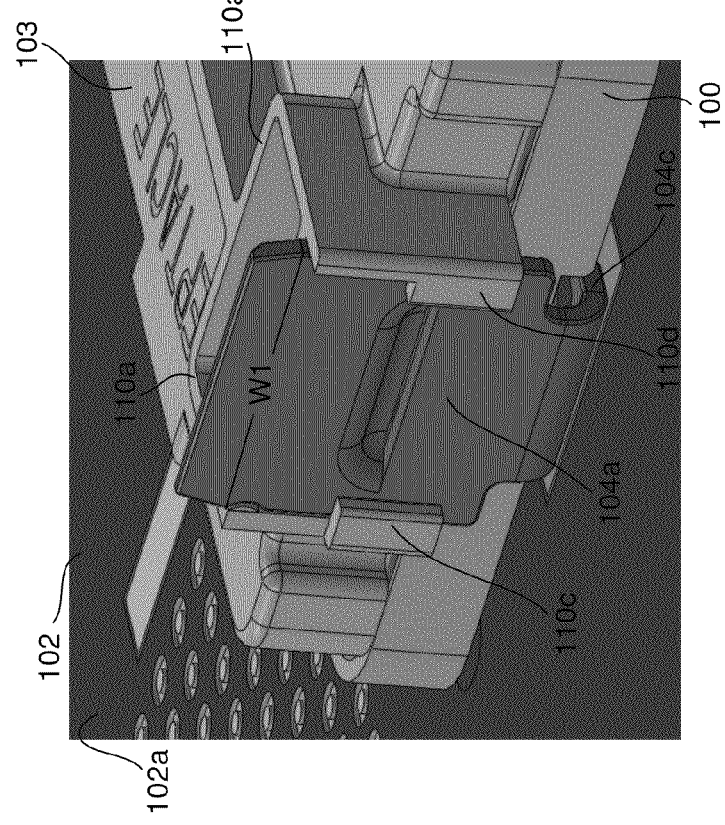
FIG. 2F is an enlargement of a portion of the view shown in FIG. 2C that shows the mechanism for mechanically coupling the lugs to the cover.

FIG. 2D shows the socket 100 mounted on the upper surface 102a of the host CB 102 with the cover 103 removed and with a parallel optical communications module 105 positioned above the socket 100 on a mezzanine-type plug 106. The plug 106 may be viewed as being part of the module 105. FIG. 2E shows the socket 100 mounted on the upper surface 102a of the host CB 102 and the module 105/plug 106 mounted on the socket 100 and held in place by the first and second lugs 104a and 104b, respectively. FIG. 2F is an enlarged view of the portion of the view shown in FIG. 2C that is within the dashed circle 107, which shows the mechanism 110a for mechanically coupling the lugs 104a and 104b to the cover 103. FIG. 2G shows the view shown in FIG. 2F, but with the lug 104a removed to show features of the mechanism 110a of the cover 103 for holding the lug 104a in place while the socket 100 is being soldered to the upper surface 102a of the host CB 102. This embodiment will now be described with reference to FIGS. 2A-2G.

With reference to FIG. 2B, the socket 100 having the cover 103 mechanically coupled thereto with the lugs 104a and 104b mechanically coupled to the cover 103 is typically assembled prior to shipment to the customer. After shipment of the assembly 120 to the customer, the customer mounts the assembly 120 on the upper surface 102a of the host CB 102, as shown in FIG. 2C. The mechanism 110 (FIG. 2B) of the cover 103 is used to mechanically couple the lugs 104a and 104b to the cover 103 and to hold the lugs 104a and 104b in place while the assembly 120 is mounted on the upper surface 102a of the host CB 102. The mechanism 110 comprises first and second lug-holding portions 110a and 110b, respectively, for holding the first and second lugs 104a and 104b, respectively, in place on the cover 103.

As shown in FIGS. 2F and 2G, the lug-holding portion 110a has first and second lug-retaining features 110c and 10d, respectively, that are spaced apart by a distance, D1, that is slightly less than the width, W1, of the first lug 104a such that the lug 104a snaps into grooves 110e and 110f (FIG. 2G) formed in the first and second lug-retaining features 110c and 110d, respectively. The portions of the features 110c and 110d that are on either side of the grooves 110e and 110f press against the portions of the lug 104a that are within the grooves 110e and 110f to create a friction fit. This friction fit prevents the lug 104a from sliding out of the first and second lug-retaining features 110c and 110d, respectively. The lug-holding portion 110b (FIG. 2A) has these same lug-retaining features for retaining the second lug 104b, but they are not shown in the figures for ease of illustration.

One of the primary differences between the lug-holding portions 110a and 110b shown in FIG. 2G and the lug-holding portions 10a and 10b shown in FIG. 1G is that the lug-holding portions 110a and 110b do not extend out from the sides of the cover 103 as far as the lug-holding portions 10a and 10b extend out from the sides of the cover 3. For this reason, the assembly 120 (FIG. 2B) has a smaller footprint on the upper surface 102a of the host CB 102 and therefore can be mounted adjacent other like assemblies 120 with higher mounting density, i.e., with a smaller pitch between adjacent assemblies 120.

The lower ends 104c and 104d (FIGS. 2A and 2B) of the first and second lugs 104a and 104b, respectively, curve inwardly and pass into cut away areas 100a (FIG. 2A) formed in the socket 100 such that the outer surfaces of the lower ends 104c and 104d are generally flush with the lower surface 100c of the bottom 100b of the socket 100. As shown in FIGS. 2A and 2B, the upper surface 102a of the host CB 102 has an array of solder contacts 102c disposed on it. The upper surface 102a of the host CB 102 also has first and second solder pads, or strips, 102d and 102e, respectively, disposed on it on opposite sides of the array of solder contacts 102c (FIGS. 2A and 2B). When the assembly 120 (FIG. 2B) made up of the assembled socket 100, cover 103 and lugs 104a and 104b is to be mounted on the upper surface 102a of the host CB 102, the assembly 120 is aligned with the array of solder contacts 102c and with the solder strips 102d and 102e.

In accordance with this illustrative embodiment, the socket 100 has a BGA (not shown) disposed on the lower surface 100c of the bottom 100b of the socket 100. As is well known in the art, in order to connect the contacts of the BGA of a mezzanine-type socket with the respective solder contacts of an array disposed on a surface of a host CB, a solder reflow process is performed during which respective solder bonds are formed between the electrical contacts of the BGA and the respective electrical contacts of the array disposed on the upper surface of the host CB. In accordance with this illustrative embodiment, this type of known solder reflow process is used to make the electrical connections between the electrical contacts of the BGA of the socket 100 and the respective electrical contacts of the array 102c disposed on the upper surface 102a of the host CB 102.

In addition, when the socket 100 is brought into alignment with the array 102c, the first and second solder strips 102d and 102e are brought into alignment with the lower ends 104c and 104d, respectively, of the first and second lugs 104a and 104b, respectively (FIG. 2B). When the socket 100 is placed on the upper surface 102a of the host CB 102, the lower ends 104c and 104d of the first and second lugs 104a and 104b, respectively, come into contact with the first and second solder strips 102d and 102e, respectively. The same solder reflow process that is used to make the electrical connections between the BGA of the socket 100 and the electrical contacts of the array 102c preferably is used to solder the lower ends 104c and 104d of the first and second lugs 104a and 104b, respectively, to the first and second solder strips 102d and 102e, respectively.

The alignment and placement processes are typically performed using a known pick-and-place system that includes a machine vision system (not shown) for determining optical alignment and a known robotic system (not shown) for imparting relative motion between the socket 100 and the host CB 102. As indicated above, because such systems are well know in the art, the system that is used for this purpose will not be described herein in the interest of brevity. When the cover 103 is secured to the socket 100, as shown in FIGS. 2A and 2B, the pick-and-place system may pick up the assembly 120 by the cover 103 and mount the assembly 120 on the upper surface 102a of the host CB 102.

Once the assembly 120 has been mounted on the upper surface 102a of the host CB 102 and the solder bonds have been formed, as shown in FIG. 2C, the cover 103 is removed to expose the array of electrical contacts 100d disposed on the upper surface 100e of the bottom 100b of the socket 100, as shown in FIG. 2D. The array of electrical contacts 100d is typically an array of metal spring fingers. The parallel optical communications module 105 is mounted on a mezzanine-type plug 106, as shown in FIG. 2D. The assembled module 105/plug 106 is mounted on the upper surface 100e of the bottom 100b of the socket 100 such that the electrical contacts of the array 100d disposed on the upper surface 100e come into contact with the respective electrical contacts of the array 106a disposed on the lower surface of the plug 106. Through all of these electrical connections, electrically-conductive pathways are provided between the host CB 102 and the module 105.

Once the assembled module 105/plug 106 has been mounted in the socket 101 as shown in FIG. 2E, protrusions 104a' and 104b' (FIG. 2D) formed on the inward-facing surfaces of the lugs 104a and 104b, respectively, snap onto and abut an upper surface 105a (FIG. 2E) of the module 105. The protrusions 104a' and 104b' exert downwardly directed forces on the module 105 that prevent the module 105 from moving in the opposite direction, i.e., from moving in a direction up and way from the surface 102a of the host CB 102.

It should be noted that the lugs 4a, 4b, 104a, and 104b themselves and the mechanisms 10 and 110 for holding the lugs 4a, 4b, 104a, and 104b in position can have a wide variety of shapes and features. The shapes and features described above are merely examples of possible shapes and features that these components can have to allow them to perform the above-described functions. It will be understood by those skilled in the art, in view of the description being provided herein, that the lugs and the mechanisms for holding them in position are not limited to the examples given herein. The lugs and the lug-holding mechanisms may have any shapes and configurations that allow them to perform the above-described functions.

Figure 3A:
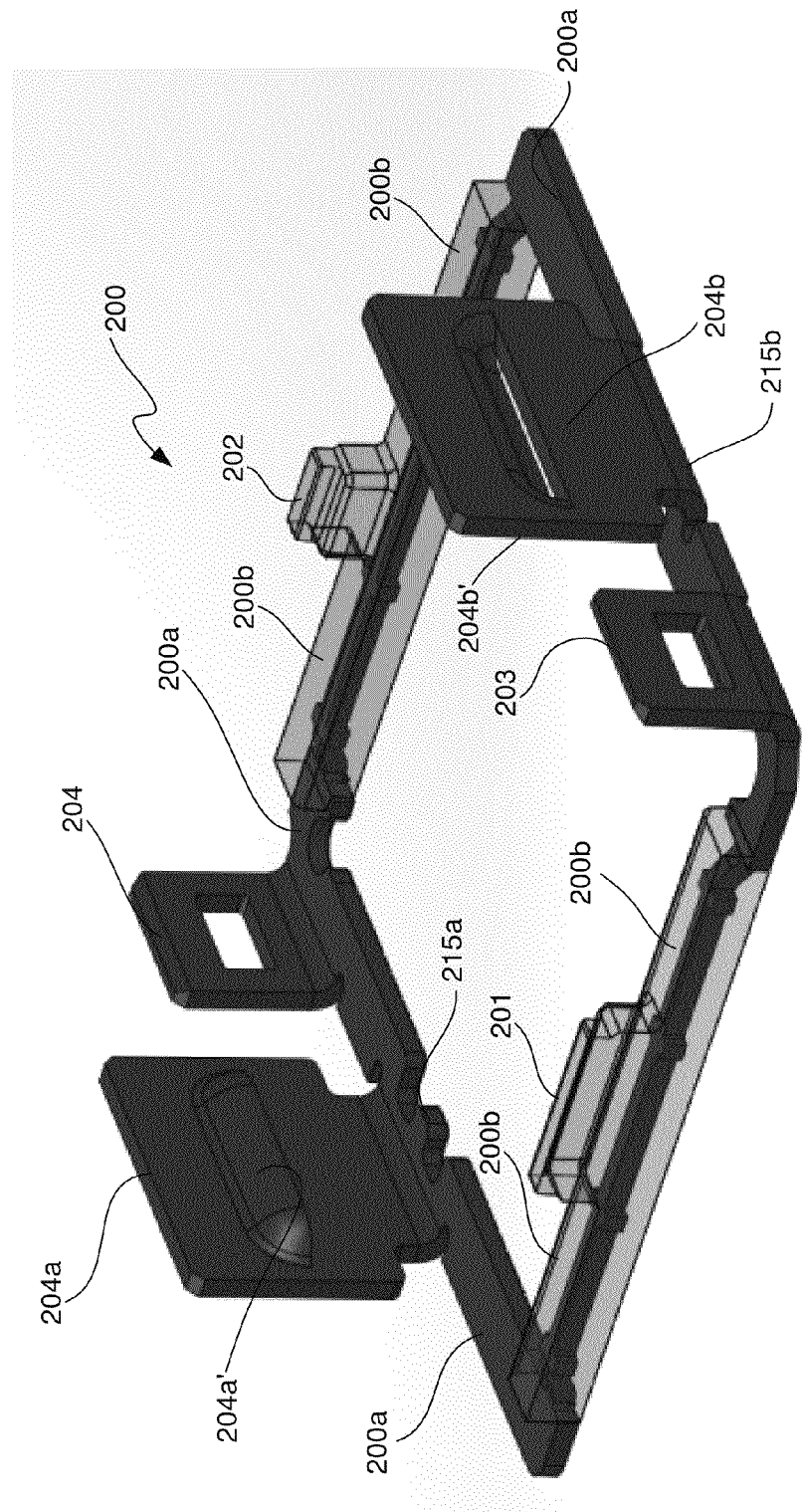
FIG. 3A is a perspective view of the socket in accordance with another illustrative embodiment.
Figure 3B:
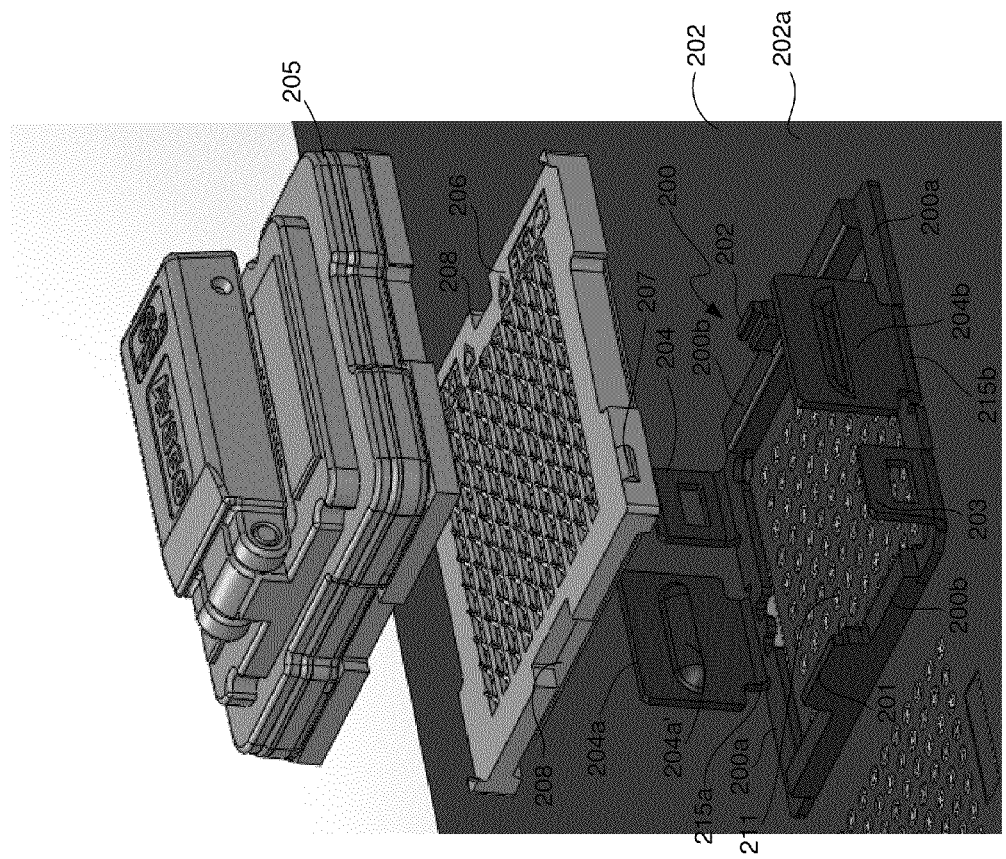
FIG. 3B is a perspective view of the socket shown in FIG. 3A secured to an upper surface of a host CB and having an interposer and a parallel optical communications module positioned above the socket and the host CB.
Figure 3C:
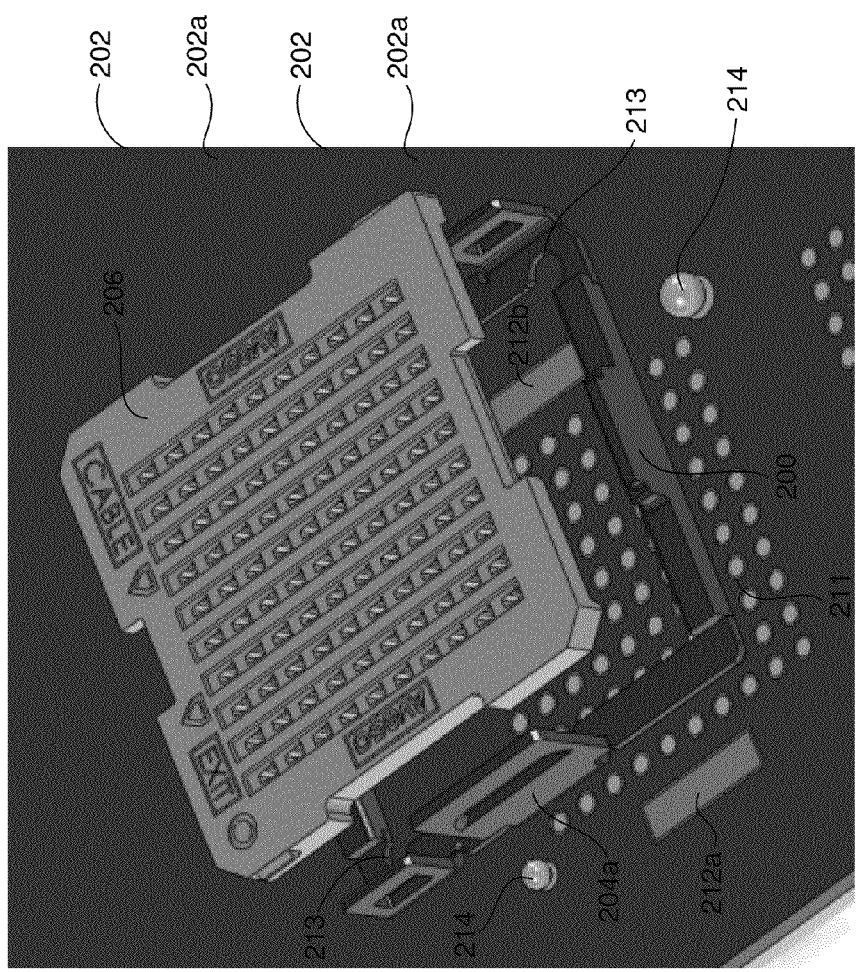
FIG. 3C is a perspective view of the socket and the interposer shown in FIG. 3B positioned above the upper surface of the host CB without the module.
Figure 3D:
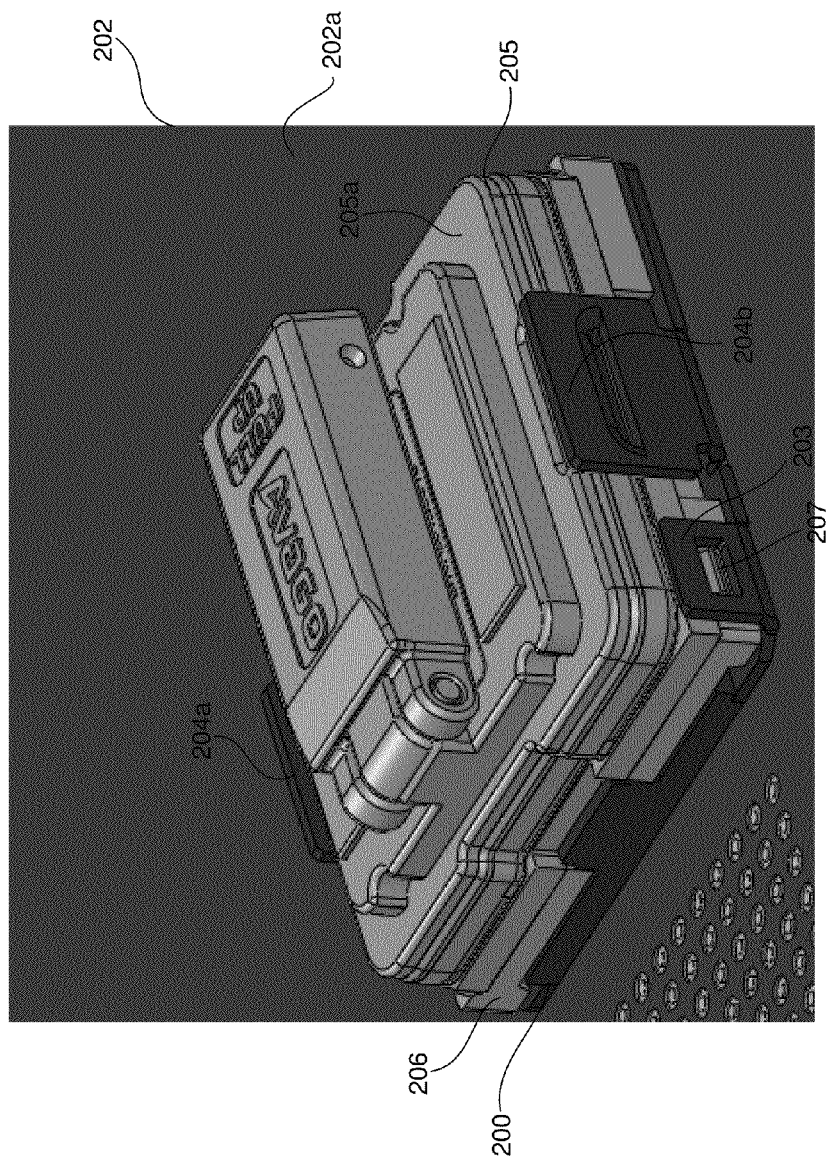
FIG. 3D is a perspective view of the socket shown in FIG. 3C secured to the upper surface of the host CB with the module and interposer mounted on the socket.

FIGS. 3A-3D are top perspective views of the socket 200 in accordance with another illustrative embodiment. FIG. 3A is a perspective view of the socket 200 by itself. FIG. 3B is a perspective view of the socket 200 secured to an upper surface 202a of a host CB 202 and having an interposer 206 and a parallel optical communications module 205 positioned above the socket 200. FIG. 3C is a perspective view of the socket 200 and the interposer 206 positioned above the upper surface 202a of the host CB 202. The interposer 206 may be viewed as being part of the module 205. FIG. 3D is a perspective view of the socket 200 secured to the upper surface 202a of the host CB 202 and having the module 205/interposer 206 mounted thereon. This embodiment of the socket 200 will now be described with reference to FIGS. 3A-3D.

With reference to FIG. 3A, the socket 200 is made of sheet metal 200a and plastic 200b that together form a generally rectangular frame that has no bottom. The socket 200 is typically manufactured using an insert-molding process. The socket 200 includes plastic features 201 and 202 that are molded about the sheet metal 200a. The socket 200 has first and second lugs 204a and 204b integrally formed in the sheet metal 200a. The first and second lugs 204a and 204b are very similar to the first and second lugs 4a and 4b, respectively, shown in FIG. 1A. The socket 200 includes sheet metal locking features 203 and 204 that are integrally formed in the sheet metal 200a.

With reference to FIG. 3B, the interposer 206 includes protruding features 207 that engage respective openings formed in the sheet metal features 203 and 204 when the interposer 206 is mounted in the socket 200, as shown in FIG. 3D. The plastic features 201 and 202 have protrusions on them that interlock with indentations 208 (FIG. 3B) formed in the interposer 206 when the interposer 206 is mounted in the socket 200. With reference to FIG. 3C, prior to mounting the socket 200 on an upper surface 202a of the host CB 202, the socket 200 is aligned with an array of solder contacts 211 disposed on the upper surface 202a of the host CB and with first and second solder pads, or strips, 212a and 212b disposed on the upper surface 202a of the host CB 202. The socket 200 may have circular openings 213 formed therein that are complementary in shape to the shapes of two mechanical features (e.g., metal balls or pins) 214 disposed on the upper surface 202a of the host CB 202. Alignment of the socket 200 with the host CB 202 may be performed by aligning the mechanical features 214 with the circular openings 213 such that when the socket 200 is mounted on the upper surface 202a of the host CB 202, the mechanical features 214 are received within the respective openings 213.

When the socket 200 is brought into alignment in this manner and is mounted on the upper surface 202a of the host CB 202, the sheet metal portions 215a and 215b (FIGS. 3A and 3B) of the socket 200 that extend beneath the lugs 204a and 204b, respectively, come into contact with the first and second solder strips 212a and 212b (FIG. 3C), respectively. A solder reflow process is subsequently performed to form the solder bonds between the respective contacts of the interposer 206 and of the array 211 (FIG. 3C) disposed on the upper surface 202a of the host CB 202. During this solder reflow process, the sheet metal portions 215a and 215b (FIGS. 3A and 3B) preferably are soldered to the solder strips 212a and 212b (FIG. 3C), respectively.

The solder bonds that secure the sheet metal portions 215a and 215b of the socket 200 to the solder strips 212a and 212b of the host CB 202 prevent the socket 200 from moving relative to the host CB 202. The lugs 204a and 204b have protrusions 204a' and 204b' (FIG. 3A), respectively, on their inwardly-facing surfaces. When the module 205/interposer 206 is secured to the socket 200, as shown in FIG. 3D, these protrusions 204a' and 204b' snap onto and abut the surface 205a of the module 205 and exert downwardly-directed forces on the module 205. These downwardly-directed forces prevent the module 205 from moving in directions up and away from the socket 200.

Figure 4B:
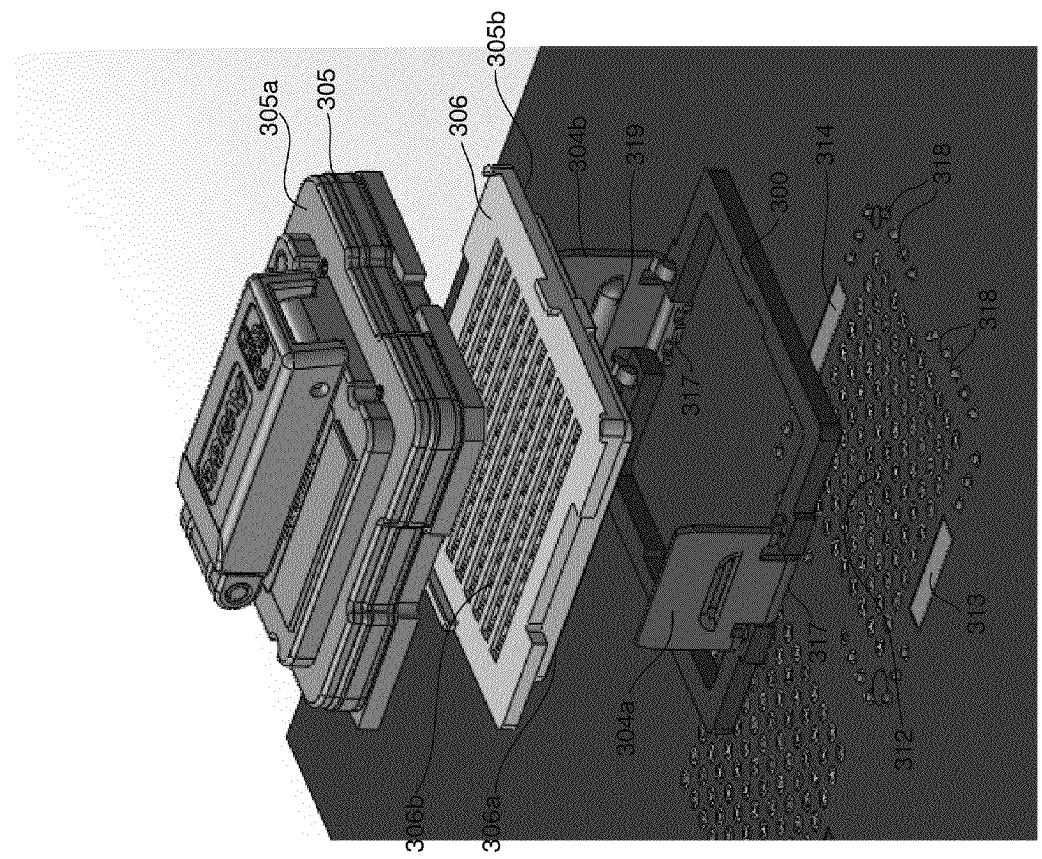
FIG. 4B is a perspective view of the socket, the parallel optical communications module, and the interposer shown in FIG. 4A after the socket has been assembled.
Figure 4C:
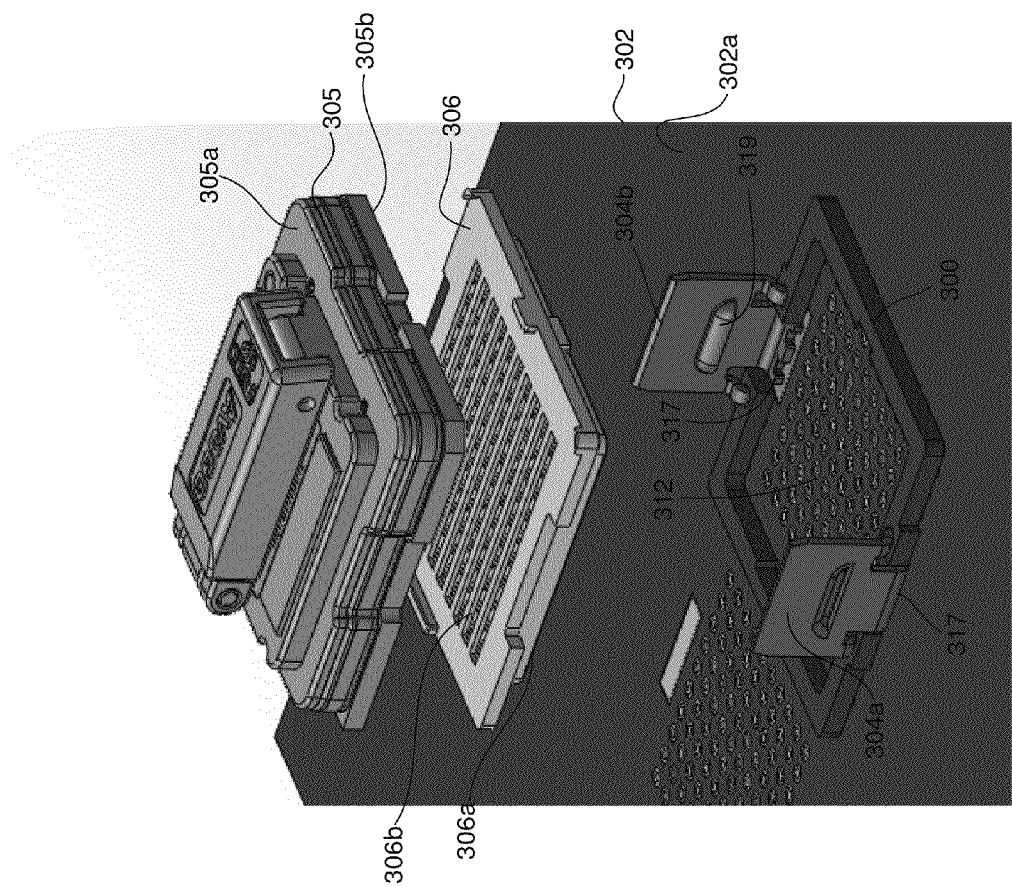
FIG. 4C is a perspective view of the assembled socket shown in FIG. 4B mounted on an upper surface of the host CB with the parallel optical communications module and the interposer positioned above the socket.
Figure 4D:
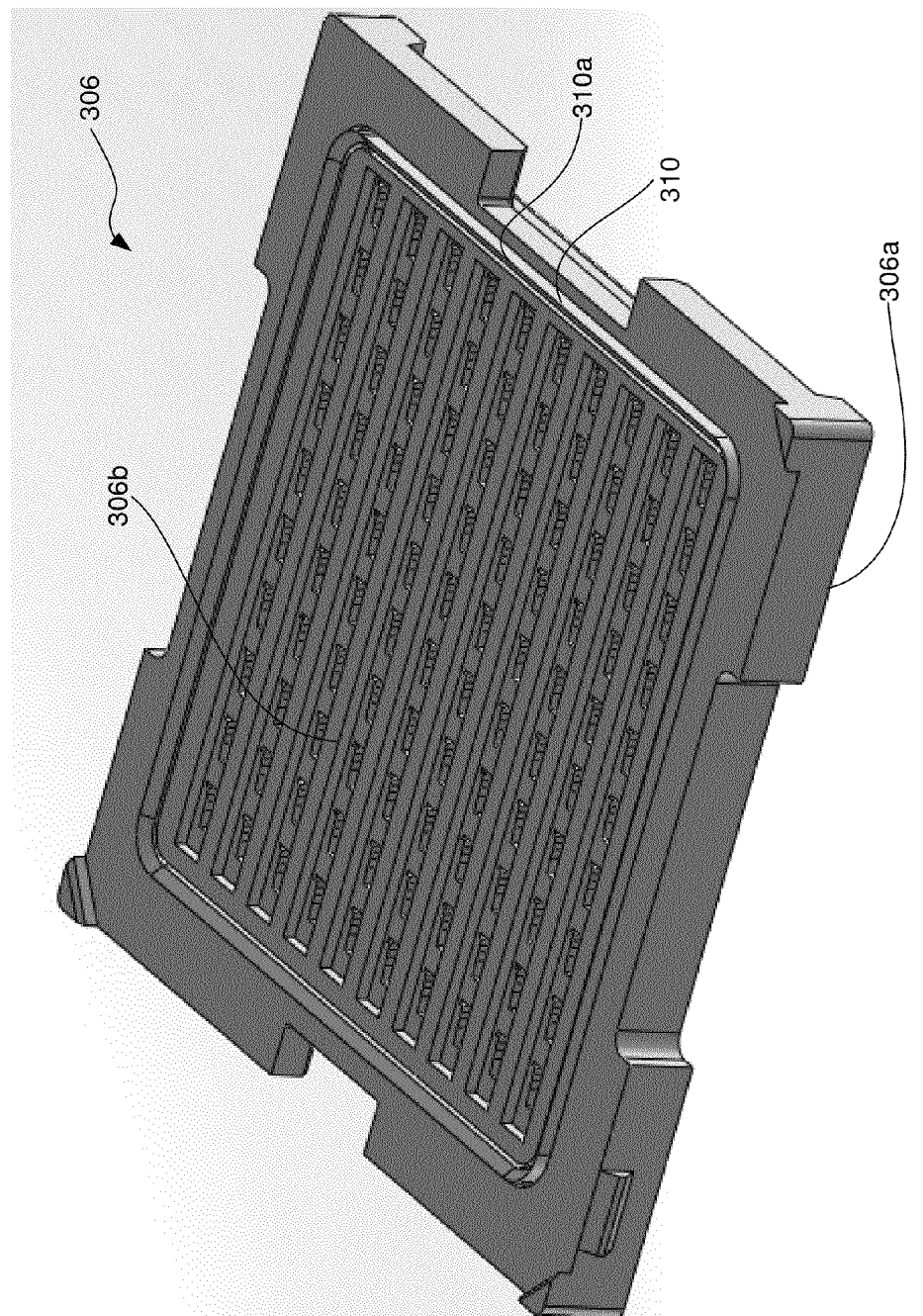
FIG. 4D is a top perspective view of the interposer shown in FIGS. 4A-4C in accordance with an illustrative embodiment that includes a sealing mechanism that prevents mixed flow gasses from degrading the electrical contacts disposed on the upper surface of an interposer and on a lower surface of a parallel optical communications module.

FIGS. 4A-4C are top perspective views of the socket 300 in accordance with another illustrative embodiment. FIG. 4D is a top perspective view of the interposer 306 shown in FIGS. 4A-4C in accordance with an illustrative embodiment that includes a sealing mechanism that prevents mixed flow gasses from degrading the electrical contacts disposed on the upper surface of an interposer 306 and on a lower surface of a parallel optical communications module 305. In FIG. 4A, the socket 300 is shown before it has been fully assembled, with the parallel optical communications module 305 and the interposer 306 positioned above the socket 300 and above a host CB 302. In FIG. 4B, the socket 300 is shown after it has been assembled, with the parallel optical communications module 305 and the interposer 306 positioned above the socket 300 and above the host CB 302. In FIG. 4C, the assembled socket 300 is shown mounted on an upper surface 302a of the host CB 302 with the parallel optical communications module 305 and the interposer 306 positioned above the socket 300. The interposer 306 may be viewed as being part of the module 305.

With reference to FIG. 4A, in accordance with this illustrative embodiment, the socket 300 is made of the same substrate material that is used to make the host CB 302. The socket 300 includes first and second lugs 304a and 304b, respectively, that are typically made of sheet metal and that typically have the same shape as the first and second lugs 4a and 4b, respectively, shown in FIG. 1A. The lugs 304a and 304b have features 315a and 315b, respectively, that mate with openings 316a and 316b, respectively, formed in the socket 300. The openings 316a and 316b have shapes that are complementary to the shapes of the features 315a and 315b, respectively. Solder pads (not shown) are disposed inside of the openings 316a and 316b. The solder pads are soldered to the features 315a and 315b to bond the lugs 304a and 304b to the socket 300.

After the lugs 304a and 304b have been assembled on the socket 300, as shown in FIG. 4B, the socket 300 is aligned with an array of electrical contacts 312 and with solder pads, or strips, 313 and 314 disposed on the upper surface 302a of the host CB 302. The socket 300 with the lugs 304a and 304b secured thereto is then mounted on the upper surface 302a of the host CB 302, as shown in FIG. 4C. When the socket 300 is mounted on the upper surface 302a of the host CB 302, the lower portions 317 of the first and second lugs 304a and 304b come into contact with the first and second solder strips 313 and 314, respectively. The rectangular portion of the socket 300 has metal features (not shown) on its lower surfaces that come into contact with solder balls 318 (FIGS. 4A and 4B) disposed along the outer periphery of the array 312. A solder reflow process is performed to solder the lugs 304a and 304b to the solder strips 313 and 314, respectively, and to solder the lower surfaces of the rectangular portion of the socket 300 to the solder balls 318.

The solder bonds secure the socket 300 to the upper surface 302a of the host CB 302 and secure the lugs 304a and 304b to the strips 313 and 314, respectively. These solder bonds prevent the socket 300 from moving relative to the host CB 302. The lugs 304a and 204b have protrusions 319 (FIGS. 4B and 4C) on their inwardly-facing surfaces. The interposer 306 is mounted in the socket 300 such that an array of electrical contacts 306a disposed on the lower surface of the interposer 306 is electrically connected with the array of electrical contacts 312 disposed on the upper surface 302a of the host CB 302. The module 305 is mounted on the interposer 306. When the module 305 is mounted on the interposer 306, the protrusions 319 of the lugs 304a and 304b snap onto and abut the surface 305a of the module 305 and exert downwardly-directed forces on the module 305. These downwardly-directed forces prevent the module 305 from moving in directions up and away from the socket 300. When the module 305 is mounted on the interposer 306, an array of electrical contacts 306b disposed on the upper surface of the interposer 306 comes into contact with an array of electrical contacts 305b disposed on the lower surface of a PCB (not shown) of the module 305.

With reference to FIG. 4D, the interposer 306 is shown by itself. In accordance with this embodiment, the interposer 306 includes a mechanism that prevents mixed flow gasses from degrading the arrays of electrical contacts 306b and 305b disposed on the upper surface of the interposer 306 and on the lower surface of the module 305, respectively. Typically, when a mezzanine-type module is mounted on an interposer, a gap exists between the upper surface of the interposer and the lower surface of the module. This gap can allow mixed flow gasses to come into contact with the electrical contacts of the arrays 305b and 306b. Mixed flow gasses can corrode the contact plating to expose the base metal (e.g., copper) of the contacts. The corrosion increases the contact resistance, which is undesirable and can degrade performance. Also, as temperature increases, degradation of the contacts worsens.

One solution that has been used in the past to prevent mixed flow gasses from degrading the electrical contacts involves using a suitable underplating for the contacts and gold plating the contacts with gold of a specific thickness. The contacts are then rigorously tested. While the solution typically achieves acceptable results, the gold plating treatment and the testing make the solution relatively costly to implement. Also, for modules that operate at higher temperatures, this solution becomes even more costly because the gold plating must be made thicker to prevent corrosion from creating open circuits.

In accordance with an illustrative embodiment, the mechanism that is employed to prevent mixed flow gasses from degrading the contacts of the arrays 305b and 306b is a flexible feature 310 disposed on the upper surface of the interposer 306 that encircles, or enrings, the area on the upper surface of the interposer 306 in which the array of electrical contacts 306b is disposed. The flexible feature 310 is typically made of plastic, but may be made of any suitable material that will act as a seal against mixed flow gasses. When the module 305 is mounted on the interposer 306, the module 305 presses down against the feature 310 causing a flexible ridge 310a that runs along the length of the feature 310 to deform against the lower surface of the module 305. The deformation of the ridge 310a forms a seal between the lower surface of the module 305 and the upper surface of the interposer 306 that encircles both of the arrays 305b and 306b. This seal prevents mixed flow gasses from entering the sealed off areas where the arrays 305b and 306b are located, thereby preventing mixed flow gasses from coming into contact with and degrading the electrical contacts of the arrays 305b and 306b.

Although the flexible feature 310 has been described as a plastic feature with a flexible ridge that encircles the arrays 305b and 306b, other solutions that form a suitable seal between the lower surface of the module 305 and the upper surface of the interposer 306 may be used for this purpose, as will be understood by persons of skill in the art in view of the discussion being provided herein. For example, a groove could be formed in the upper surface of the interposer 306 and then an O-ring made of foam rubber could be disposed in the groove. The O-ring would deform and provide a suitable seal when the module 305 is mounted on the interposer 306.

Also, although the flexible feature 310 is shown in FIG. 4D as being disposed on the upper surface of the interposer 306, it could instead be disposed in the lower surface of the module 305. For example, a groove could be formed in the lower surface of the PCB of the module 306 and then an O-ring made of foam rubber could be disposed in the groove. The O-ring would deform and provide a suitable seal when the module 305 is mounted on the interposer 306.

The sockets and methods described above with reference to FIGS. 1A-4D represent examples of suitable sockets and methods that can be used to mid-plane mount a parallel optical communications module on a host CB without having to place holes in the host CB. The invention, however, is not limited to these examples, as will be understood by persons of skill in the art in view of the description being provided herein. The sockets and the mechanism for securing the modules to the sockets can have a variety of configurations and shapes and can be made of a variety of different materials. The illustrative embodiments described above are merely examples that are intended to demonstrate the principles and the concepts of the invention. Many modifications may be made to the embodiments described while still achieving the goal of the invention. All such modifications are within the scope of the invention.

What is claimed is:

1. An apparatus for mounting a parallel optical communications module in a plane of a mounting surface of a host circuit board (CB), the apparatus comprising:

a socket configured to interface a parallel optical communications module with a host CB, the socket having first and second cut away areas formed in opposing bottom edges of the socket;

first and second lugs mechanically coupled to opposing outer surfaces of the socket such that inwardly curved portions of the first and second lugs pass into the first and second cut away areas, respectively, the first and second lugs being configured to abut against one or more surfaces of the parallel optical communications module when the module is mounted in the socket such that the lugs exert forces on the module in directions toward the mounting surface of the host CB to prevent movement of the module relative to the host CB when the socket is secured to the mounting surface of the host CB by soldering the inwardly curved portions of the first and second lugs to first and second solder pads, respectively, disposed on the mounting surface of the host CB; and a removable cover having first and second lug-holding portions configured to hold the first and second lugs in place while the inwardly curved portions of the first and second lugs are soldered to the first and second solder pads, the removable cover configured to be removed from the socket prior to mounting of the parallel optical communications module in the socket.

2. The apparatus of claim 1, wherein the socket includes sides and a bottom, the bottom having an upper surface and a lower surface, the upper surface of the bottom having a first array of electrical contacts thereon, the lower surface of the bottom having a second array of electrical contacts thereon.

3. The apparatus of claim 2, wherein the removable cover covers the first array of electrical contacts disposed on the upper surface of the bottom of the socket to protect the first array of electrical contacts from the environment.

4. The apparatus of claim 1, wherein the socket comprises a generally rectangular frame comprising plastic portions and sheet metal portions.

5. The apparatus of claim 1, wherein the socket comprises a generally rectangular frame comprising a substrate material that is a same material of which the host CB is made.

6. The apparatus of claim 1, wherein the first and second lug-holding portions include first and second lug-retaining features respectively, and wherein the first and second lugs snap into respective first and second grooves formed in the first and second lug-retaining features.

7. The apparatus of claim 6, wherein each of the first and second lug-retaining features has a pair of side extensions that press against the sides of the first and second lugs when the first and second lugs are snapped into the respective first and second grooves.

8. A mid-plane mounting system comprising:

a host circuit board (CB) having at least one mounting surface, the mounting surface having at least first and second solder pads and an array of electrical contacts disposed thereon;

a socket configured to interface a parallel optical communications module with the host CB, the socket having first and second lugs mechanically coupled therewith, the first and second lugs having first and second inwardly curved portions, respectively, that are secured by solder bonds to the first and second solder pads, respectively, wherein the solder bonds prevent movement of the socket relative to the host CB;

a parallel optical communications module mounted in the socket, wherein the first and second lugs abut one or more surfaces of the module and exert forces on the module in directions toward the mounting surface of the host CB to prevent movement of the module relative to the host CB; and a removable cover having first and second lug-holding portions configured to hold the first and second lugs in place while the inwardly curved portions of the first and second lugs are soldered to the first and second solder pads, the removable cover configured to be removed from the socket prior to mounting of the parallel optical communications module in the socket.

9. The system of claim 8, wherein the socket includes sides and a bottom, the bottom having an upper surface and a lower surface, the upper surface of the bottom having a first array of electrical contacts thereon, the lower surface of the bottom having a second array of electrical contacts thereon, wherein the electrical contacts of the first array are in contact with respective electrical contacts of a third array of electrical contacts disposed on a lower surface of the module, and wherein the electrical contacts of the second array are in contact with electrical contacts of the array of electrical contacts disposed on the mounting surface of the host CB.

10. The system of claim 9, wherein the electrical contacts of the first array are electrically-conductive spring fingers and wherein the electrical contacts of the second array are electrically-conductive balls.

11. The system of claim 9, wherein the electrical contacts of the first array are electrically-conductive spring fingers and wherein the electrical contacts of the second array are electrically-conductive lands.

12. The system of claim 8, wherein the socket comprises a generally rectangular frame comprising plastic portions and sheet metal portions, and wherein the first and second lugs are mechanically coupled with the frame.

13. The system of claim 8, wherein the socket comprises a generally rectangular frame comprising a substrate material that is a same material of which the host CB is made, and wherein the first and second lugs are mechanically coupled with the frame.

14. A method for mid-plane mounting a parallel optical communications module on a host circuit board (CB), the method comprising:

providing a host CB having at least one mounting surface, the mounting surface having at least first and second solder pads and an array of electrical contacts disposed thereon;

providing a socket configured to interface a parallel optical communications module with the host CB, the socket including first and second lugs mechanically coupled with the socket;

aligning the socket with the array of electrical contacts and with the first and second solder pads disposed on the mounting surface of the host CB and mounting the socket on the mounting surface of the host CB in the aligned position;

attaching to the socket, a removable cover having first and second lug-holding portions;

using the first and second lug-holding portions of the removable cover to hold the first and second lugs in place while soldering inwardly curved portions of the first and second lugs to the first and second solder pads, respectively, wherein the solder bonds prevent, or at least reduce, movement of the socket relative to the host CB;

detaching the removable cover from the socket; and mounting a parallel optical communications module in the socket such that the first and second lugs abut one or more surfaces of the module and exert forces on the module in directions toward the mounting surface of the host CB, wherein the exertion of forces on the module prevents movement of the module relative to the host CB.

15. The method of claim 14, wherein the socket includes sides and a bottom, the bottom having an upper surface and a lower surface, the upper surface of the bottom having a first array of electrical contacts thereon, the lower surface of the bottom having a second array of electrical contacts thereon, wherein the electrical contacts of the first array are in contact with respective electrical contacts of a third array of electrical contacts disposed on a lower surface of the module, and wherein the electrical contacts of the second array are in contact with respective electrical contacts of the array of electrical contacts disposed on the mounting surface of the host CB.

16. The method of claim 15, wherein the electrical contacts of the first array are electrically-conductive spring fingers and wherein the electrical contacts of the second array are electrically-conductive balls.

17. The method of claim 15, wherein the electrical contacts of the first array are electrically-conductive spring fingers and wherein the electrical contacts of the second array are electrically-conductive lands.

18. The method of claim 15, wherein the cover covers the first array of electrical contacts disposed on the upper surface of the bottom of the socket to protect the first array of electrical contacts from the environment.

19. The method of claim 18, wherein the step of mounting the socket on the mounting surface of the host CB includes a step of using a pick-and-place system to pick the socket up by the cover and place the socket on the mounting surface of the host CB.

20. The method of claim 14, wherein the socket comprises a generally rectangular frame comprising plastic portions and sheet metal portions, and wherein the first and second lugs are mechanically coupled with the frame.

21. The method of claim 14, wherein the socket comprises a generally rectangular frame comprising a substrate material that is a same material of which the host CB is made, and wherein the first and second lugs are mechanically coupled with the frame.

22. An apparatus for mounting a parallel optical communications module in a plane of a mounting surface of a host circuit board (CB), the apparatus comprising:

a socket configured to interface a parallel optical communications module with an array of electrical contacts disposed on the mounting surface of the host CB, the socket including sides and a bottom, the bottom having an upper surface and a lower surface, the upper surface of the bottom having a first array of electrical contacts thereon, the lower surface of the bottom having a second array of electrical contacts thereon, the socket having at least first and second lugs mechanically coupled therewith, the first and second lugs being configured to abut against one or more surfaces of a parallel optical communications module when the module is mounted in the socket such that the lugs exert forces on the module in directions toward the mounting surface of the host CB to prevent movement of the module relative to the host CB, and wherein the socket is configured to be secured to the mounting surface of the host CB by soldering inwardly curved portions of the first and second lugs to first and second solder pads, respectively, disposed on the surface of the host CB; and a removable cover attached to the socket such that the removable cover protects the first array of electrical contacts from the environment, the removable cover including a lug-holding mechanism for holding the first and second lugs in place while the inwardly curved portions of the first and second lugs are soldered to the first and second solder pads, respectively, the removable cover configured to be removed from the socket prior to mounting of the parallel optical communications module in the socket.

23. The apparatus of claim 22, wherein the electrical contacts of the first array are electrically-conductive spring fingers and wherein the electrical contacts of the second array are electrically-conductive balls.

24. The apparatus of claim 22, wherein the electrical contacts of the first array are electrically-conductive spring fingers and wherein the electrical contacts of the second array are electrically-conductive lands.

* * * * *